United States Patent
Ito et al.

(10) Patent No.: US 7,122,448 B2
(45) Date of Patent: Oct. 17, 2006

(54) ANNEALING APPARATUS, ANNEALING METHOD, AND MANUFACTURING METHOD OF A SEMICONDUCTOR DEVICE

(75) Inventors: Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 10/926,306

(22) Filed: Aug. 26, 2004

(65) Prior Publication Data
US 2005/0272228 A1     Dec. 8, 2005

(30) Foreign Application Priority Data
Jun. 7, 2004   (JP) ............................ P2004-168893

(51) Int. Cl.
*H01L 21/301* (2006.01)
*H01L 21/326* (2006.01)

(52) U.S. Cl. ................. 438/467; 118/641; 257/E23.083
(58) Field of Classification Search ................. 438/467; 118/620, 641, 723 E
See application file for complete search history.

(56) References Cited

U.S. PATENT DOCUMENTS

| 4,151,008 A | 4/1979 | Kirkpatrick .................. 148/1.5 |
| 6,073,576 A * | 6/2000 | Moslehi et al. ........... 118/723 E |
| 2004/0108519 A1* | 6/2004 | Itani ........................... 257/200 |

FOREIGN PATENT DOCUMENTS

| JP | 3-253027 | 11/1991 |
| JP | 6-97100 | 4/1994 |

* cited by examiner

*Primary Examiner*—W. David Coleman
(74) *Attorney, Agent, or Firm*—Finnegan, Henderson, Farabow, Garrett & Dunner, L.L.P.

(57) ABSTRACT

An annealing apparatus, includes a substrate stage placing a semiconductor substrate; a light source facing the substrate stage, configured to irradiate a pulsed light at a pulse width of approximately 0.1 ms to 100 ms on a surface of the semiconductor substrate; and a mask configured to selectively reduce intensity of the light transmitting a peripheral region along an outer edge of the semiconductor substrate, so as to define an irradiation region by the peripheral region.

20 Claims, 18 Drawing Sheets

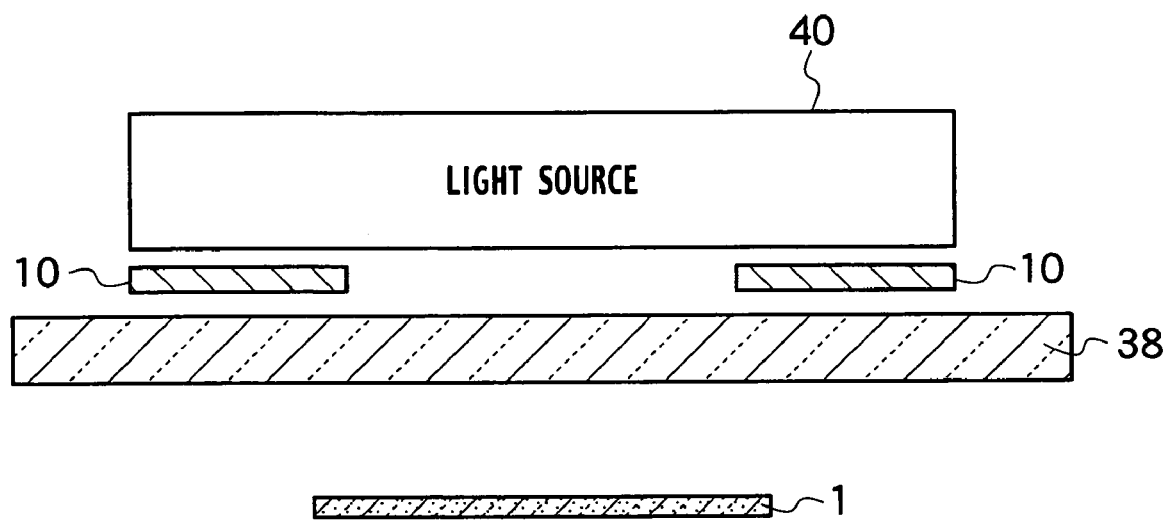
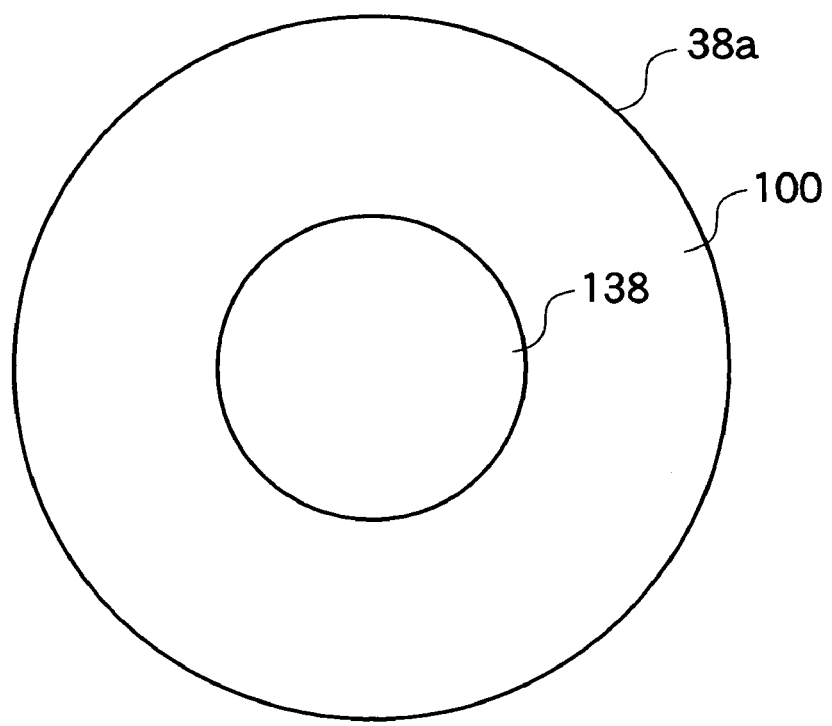

ANNEALING APPARATUS, ANNEALING METHOD, AND MANUFACTURING METHOD OF A SEMICONDUCTOR DEVICE

CROSS REFERENCE TO RELATED APPLICATIONS

This application is based upon and claims the benefit of priority from prior Japanese Patent Application P2004-168893 filed on Jun. 7, 2004; the entire contents of which are incorporated by reference herein.

BACKGROUND OF THE INVENTION

1. Field of the Invention

The present invention relates to methods for annealing a semiconductor device, and particularly to an annealing apparatus used in high intensity light sources, annealing methods and manufacturing methods of semiconductor devices.

2. Description of the Related Art

It is possible to realize improvements in semiconductor device performance-enhancing Large Scale Integration (LSI) and the like by increasing integration, or put more plainly, by miniaturization of the elements that build up a semiconductor device. Thus, LSI is becoming increasingly large-scale while miniaturization of elements such as metal-oxide-semiconductor (MOS) transistors is being taken to a whole new level. Along with the miniaturization of composing elements, parasitic resistance and short channel effects on MOS transistors and the like, increase. Thus, there is increased importance placed on the formation of low resistance layers and shallow pn junctions.

For forming a shallow pn junction with a thickness of or below twenty nm, a thin impurity doped region is formed using an ion implantation in a semiconductor substrate with low acceleration energy. The impurities doped in the semiconductor substrate are activated by an annealing process, thus forming a shallow impurity diffusion region. In order to lower layer resistance of an impurity diffusion region it is necessary to perform activation annealing of the impurities at a high temperature.

However, the diffusion coefficients of p-type impurity such as boron (B), and n-type impurity such as phosphorus (P) or arsenic (As), in the crystal of the silicon substrate, are large. In the time needed to perform rapid thermal annealing (RTA) using current halogen lamps, impurities diffuse to both the interior and exterior of a semiconductor substrate. As a result, it is impossible to form a shallow impurity diffusion region having a high concentration of impurities on the semiconductor substrate. Also, it becomes impossible to activate a high concentration of impurities if the temperature of the RTA process is lowered in order to control the diffusion of the impurities. In this manner, it is difficult to form a shallow impurity diffusion region having low resistance and a high concentration of activated impurities.

Recently a pulse light annealing method by the use of a pulse light source such as a flash lamp and a YAG laser, which can instantly supply the energy essential to impurity activation, is being tested as a solution to the RTA problem. A xenon (Xe) flash lamp has a quartz glass tube filled with Xe gas, in which electrical charges stored in capacitors and the like, are instantaneously discharged. As a result, it becomes possible to emit a high intensity white light within a range of several hundred μs to several hundred ms for instance. It is possible to attain the heat energy required for impurity activation in the instantaneous heating of a semiconductor substrate absorbing flash lamp light. Therefore, it becomes possible to activate a high concentration of impurities while leaving the concentration profile of the impurities implanted into the semiconductor substrate virtually unchanged.

However, in using flash lamp annealing, irradiation energy above 20 J/cm$^2$ is essential to ensure a sufficiently uniform activation of impurities at a high concentration, which would lead to a sudden temperature increase on the semiconductor substrate. As a result, there occurs a temperature difference in between a top surface and a bottom surface of the semiconductor substrate, which raises the amount of thermal stress in the interior of the semiconductor substrate. Thermal stress causes crystal defects such as slips and dislocations. The presence of crystal defects makes it easy for damage to occur on semiconductor substrate, leading to decreases in production yield. Thus, it is difficult to perform annealing with flash lamp annealing processes while suppressing the generation of crystal defects generated on semiconductor substrate.

SUMMARY OF THE INVENTION

A first aspect of the present invention inheres in an annealing apparatus including a substrate stage placing a semiconductor substrate; a light source facing the substrate stage, configured to irradiate a pulsed light at a pulse width of approximately 0.1 ms to 100 ms on a surface of the semiconductor substrate; and a mask configured to selectively reduce intensity of the light transmitting a peripheral region along an outer edge of the semiconductor substrate, so as to define an irradiation region by the peripheral region.

A second aspect of the present invention inheres in an annealing method including heating a semiconductor substrate to a temperature range of approximately 300° C. to 600° C.; and irradiating at least one of a surface of the semiconductor substrate and a surface of a thin film formed on the semiconductor substrate with a pulsed light at a pulse width of approximately 0.1 ms to 100 ms, by selectively reducing intensity of the light transmitting a peripheral region along an outer edge of the semiconductor substrate, so as to define an irradiation region by the peripheral region.

A third aspect of the present invention inheres in a manufacturing method of a semiconductor device including treating at least one of a semiconductor substrate and a thin film formed on the semiconductor substrate with a first process so as to provide an intermediate product of the semiconductor device; heating the semiconductor substrate to a temperature range approximately 300° C. to 600° C.; irradiating a surface of the intermediate product with a pulsed light at a pulse width of approximately 0.1 ms to 100 ms, by selectively reducing intensity of the light transmitting a peripheral region along an outer edge of the intermediate product, so as to define an irradiation region by the peripheral region; and treating the intermediate product with a second process.

BRIEF DESCRIPTION OF DRAWINGS

FIG. 11 is a diagram of showing an example of another arrangement of a mask of the annealing apparatus according to the first embodiment of the present invention.

FIG. 12 is a diagram showing another example of a mask of the annealing apparatus according to the first embodiment of the present invention.

DETAILED DESCRIPTION OF THE INVENTION

Figure 1:
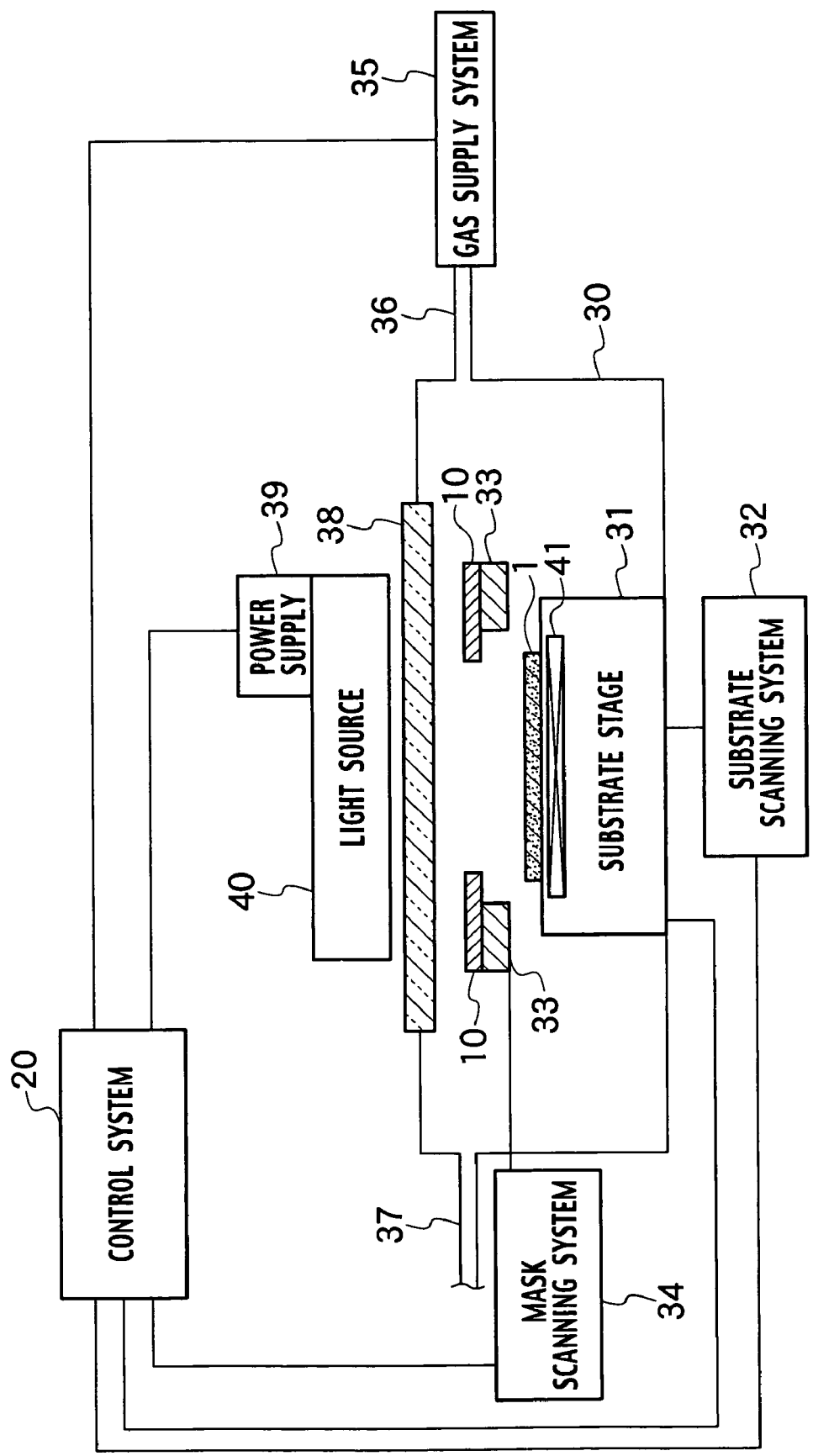
FIG. 1 is a schematic view showing an example of an annealing apparatus according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In first through third embodiments of the present invention, description will be carried out using an activation annealing process of the impurities implanted by ion implantation. For instance, P or As are used as n-type impurities, and B is used as p-type impurity. However, the annealing process according to the first through third embodiments of the present invention is not limited to an impurity activation annealing process. It is obvious that annealing processes for applications such as an insulating film formation of an oxide film and a nitride film, and recrystallization of damaged layers and the like can be put into use.

FIRST EMBODIMENT

An annealing apparatus according to a first embodiment of the present invention includes a process chamber 30, a gas supply system 35, a light source 40, and a control system 20. Feeding piping 36 and exhaust piping 37 are provided on the process chamber 30, as shown in FIG. 1. The feeding piping 36 is connected to the gas supply system 35. A transparent window 38 is disposed on top of the process chamber 30 and faces the light source 40. A substrate stage 31, on top of which a semiconductor substrate 1 is placed, is disposed facing the light source 40 on the bottom of the interior of the process chamber 30. A mask 10 is disposed in between the transparent window 38 and the semiconductor substrate 1. A mask stage 33 is disposed inside of the process chamber 30 and the mask 10 is placed on top of the mask stage 33. The substrate stage 31 and the mask stage 33 are connected to a substrate scanning system 32 and a mask scanning system 34 respectively. And a power supply 39 is connected to the light source 40. And the substrate stage 31, the substrate scanning system 32, the mask scanning system 34, the gas supply system 35 and the power supply 39 are connected to the control system 20, respectively.

The process chamber 30, which is used to carry out annealing in order to activate impurities implanted to the silicon-based semiconductor substrate 1 by ion implantation, is manufactured from a metal such as stainless steel. Materials such as stainless steel, aluminum nitride (AlN), ceramics, or quartz glass are used for the substrate stage 31. A heating source 41 used for pre-heating the semiconductor substrate 1 is provided in the interior of the substrate stage 31. An element such as a heat lamp or an embedded metallic heater made of materials such as chromium are used as the heating source 41. The control system 20 controls the temperature of the pre-heating.

The substrate scanning system 32 can move the substrate stage 31 within the plane facing the transparent window 38. The mask scanning system 34 can move the mask stage 33 within the plane facing the transparent window 38. The control system 20 controls both the substrate scanning system 32 and the mask scanning system 34.

During the annealing of the semiconductor substrate 1, an inert gas such as nitrogen ($N_2$) or argon (Ar) is fed from the gas supply system 35 through the feeding piping 36 into the process chamber 30. The inert gas fed into the process chamber 30 is exhausted through the exhaust piping 37. The flow rate of the inert gas is controlled by the control system 20.

The light source 40 such as a flash lamp irradiates a pulsed light through the transparent window 38 of synthetic quarts and the like, onto the surface of the semiconductor substrate 1, to heat the semiconductor substrate 1. The power supply 39 such as a pulse power supply drives the light source 40 at an extremely short pulse width of approximately 0.1 ms to 100 ms. The power supply 39 controls the irradiation energy and pulse width of the light beamed from the light source 40 according to the control system 20. The energy density of the light source 40 is within the range of 15 J/cm$^2$ to 40 J/cm$^2$, and desirably within 20 J/cm$^2$ to 34 J/cm$^2$. The transparent window 38 serves the function of transmitting the light beamed from the light source 40 to the semiconductor substrate 1 while maintaining an airtight barrier separating the process chamber 30 from the light source 40.

Figure 2:
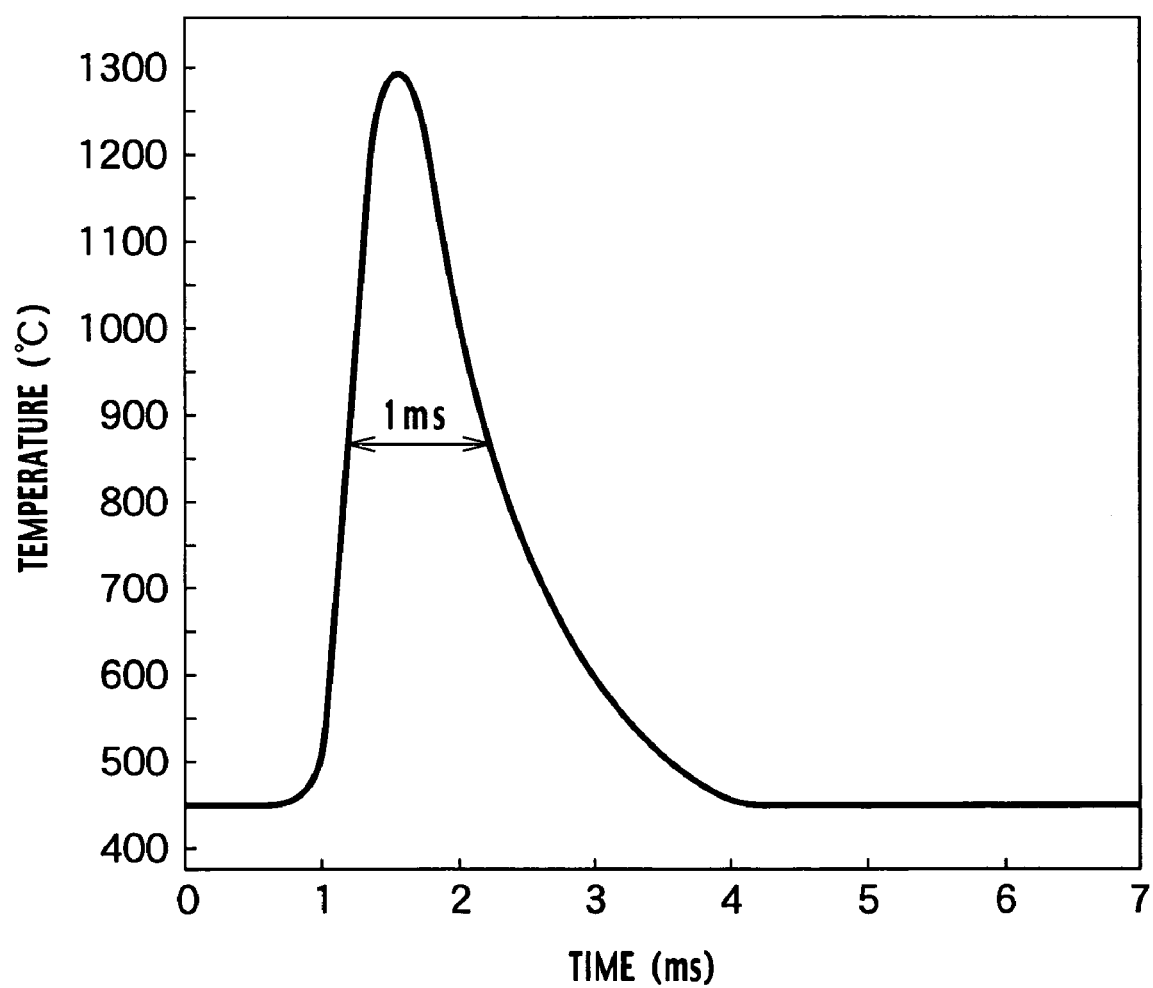
FIG. 2 is a diagram showing an example of the heating properties of a light source of an annealing apparatus according to the first embodiment of the present invention.

At 1300° C. for instance, which is highest temperature reached in the heating provided by the Xe flash lamp used on the light source 40, a thermal profile having a half width at approximately 1 ms can be attained, as shown in FIG. 2. In the Xe flash lamp it is possible to achieve precipitous increases and decreases in temperature compared to an infrared lamp such as a halogen lamp used in RTA. For instance, the thermal elevation time for a temperature between 450° C. to 1300° C. is over 10 s, for example approximately 15 s with halogen light. And a 2 s to 3 s thermal elevation time is required for temperatures thorough out the 400° C. in between the 900° C. and 1300° C. On the other hand, with flash lamp light, the thermal elevation time required for temperatures (referred to as thermal elevation time hereinafter) in between 450° C. and 1300° C. is between 0.1 ms to 100 ms, and desirably between 0.5 ms to 50 ms. Further the surface temperature of the semiconductor substrate 1 is measured by a high-speed pyrometer.

On the annealing process used to activate impurities implanted by ion implantation, since the highest temperature reached at or below a thermal elevation time of 0.1 ms is at or below 900° C., the impurities implanted to the semiconductor substrate 1 may not be sufficiently activated. And if the thermal elevation time exceeds 100 ms the highest temperature reached may exceed 1400° C. If the semiconductor substrate 1 is heated to above 1400° C., the diffusion of the implanted impurities is enhanced. As a result, it becomes difficult to form a shallow pn junction near the surface of the semiconductor substrate 1 because of the diffusion of the impurities implanted to the semiconductor substrate 1.

In an activation annealing process, the semiconductor substrate 1 placed on top of the substrate stage 31 is pre-heated by the heating source 41 within a temperature range of 300° C. to 600° C., and desirably within 400° C. to 500° C., for example. A desirable pre-heating time would be in the range of 10 s to 120 s for example. The pre-heating is set to a temperature and a time that may cause no damage on the semiconductor substrate 1. If the pre-heating temperature is below 300° C., there are cases in which the highest reached temperature will only be 900° C. or less. And if the pre-heating temperature exceeds 600° C., there are cases in which the highest reached temperature will exceed 1400° C.

In the annealing apparatus according to the first embodiment, the thermal elevation time for a temperature between 450° C. and 1300° C. is approximately 3 ms, as shown in FIG. 2. The thermal elevation time for a temperature between 900° C. and 1300° C. is approximately 1 ms. According to the first embodiment, it is possible to execute activation annealing of impurities implanted to the semiconductor substrate 1 at a temperature of above 900° C. for example, in an extremely short period of time. Therefore, it is possible to form a shallow pn junction while suppressing the impurity diffusion length, caused by activation annealing, to less than 5 nm.

Figure 3:
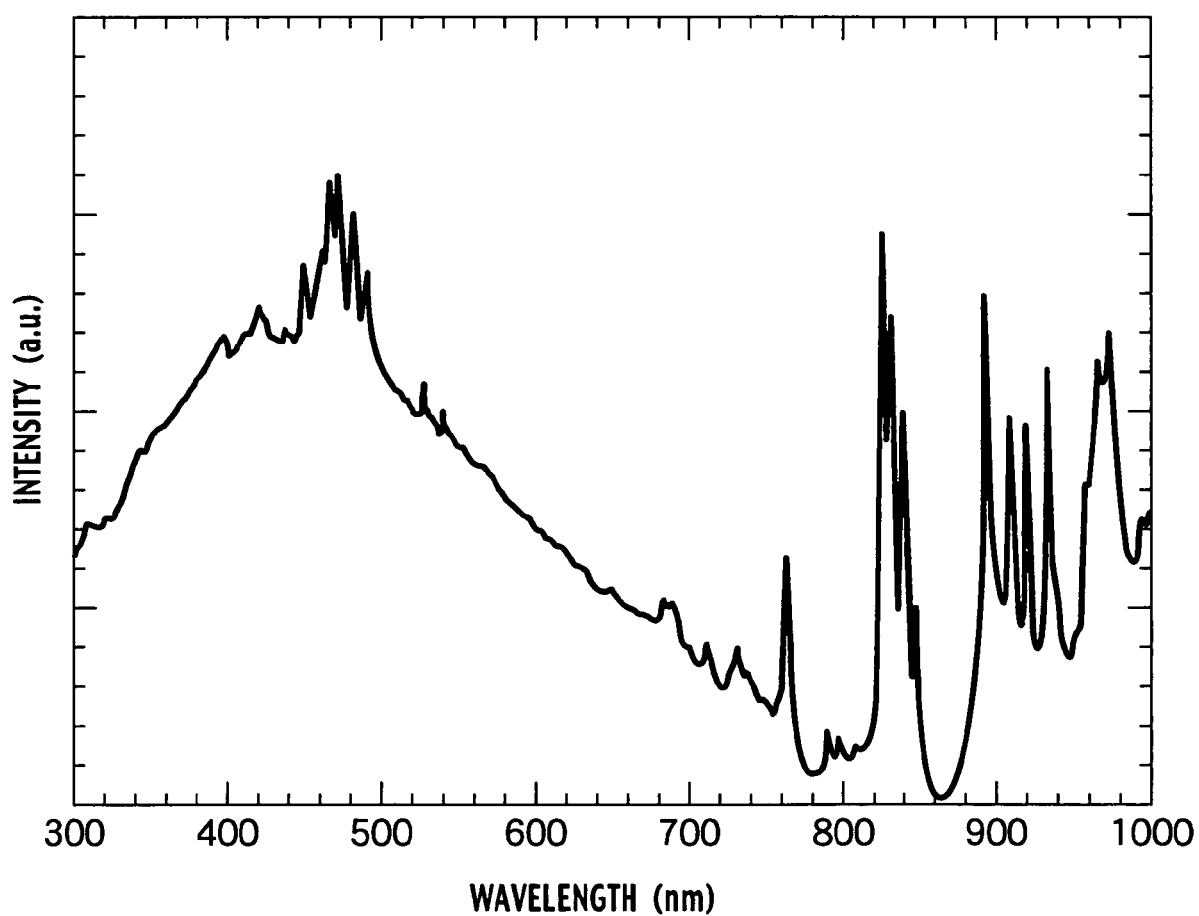
FIG. 3 is a diagram showing an example of the spectrum of a light source of an annealing apparatus according to the first embodiment of the present invention.

However, at a temperature at above 900° C. and an extremely short thermal elevation cycle, crystal defects such as slips and dislocations that are caused by thermal stress become easily generated on the semiconductor substrate 1. Further, the luminous spectrum of the Xe flash lamp of the light source 40 is close to that of white light, and has a main peak intensity wavelength of from 400 nm to 500 nm, as shown in FIG. 3. Light in the peak intensity wavelength range below 1 μm of the flash lamp, is absorbed in a region ranging from the surface of the semiconductor substrate 1 to a depth of approximately 0.1 μm. Sudden temperature increases occur at parts of the region that ranges from the surface of the semiconductor substrate 1 to a depth of several tens μm deep. As a result of the sudden temperature increases, a thermal difference of between 300° C. and 1000° C. occurs in between the top and bottom surfaces of the semiconductor substrate 1. The thermal difference causes an increase in the thermal stress in the interior of the semiconductor substrate 1. Generally, the mechanical strength of an outer edge of the semiconductor substrate 1 is weak. For instance, warping can be observed on the outer edge of the semiconductor substrate 1 even under pre-heating by the heating source 41 in a range of the 300° C. to 600° C. of the bottom surface of the semiconductor substrate 1. The occurrence of crystal defects, particularly on the outer edge of the semiconductor substrate 1, according to thermal stress in the interior of semiconductor substrate 1 is remarkable. Because of the crystal defects caused by thermal stress, the semiconductor substrate 1 will be lost to damage. As can be seen, because of the damage caused by thermal stress, cracking resistance of the semiconductor substrate 1 is insufficient in the extremely short heating provided by the light source 40.

Figure 4:
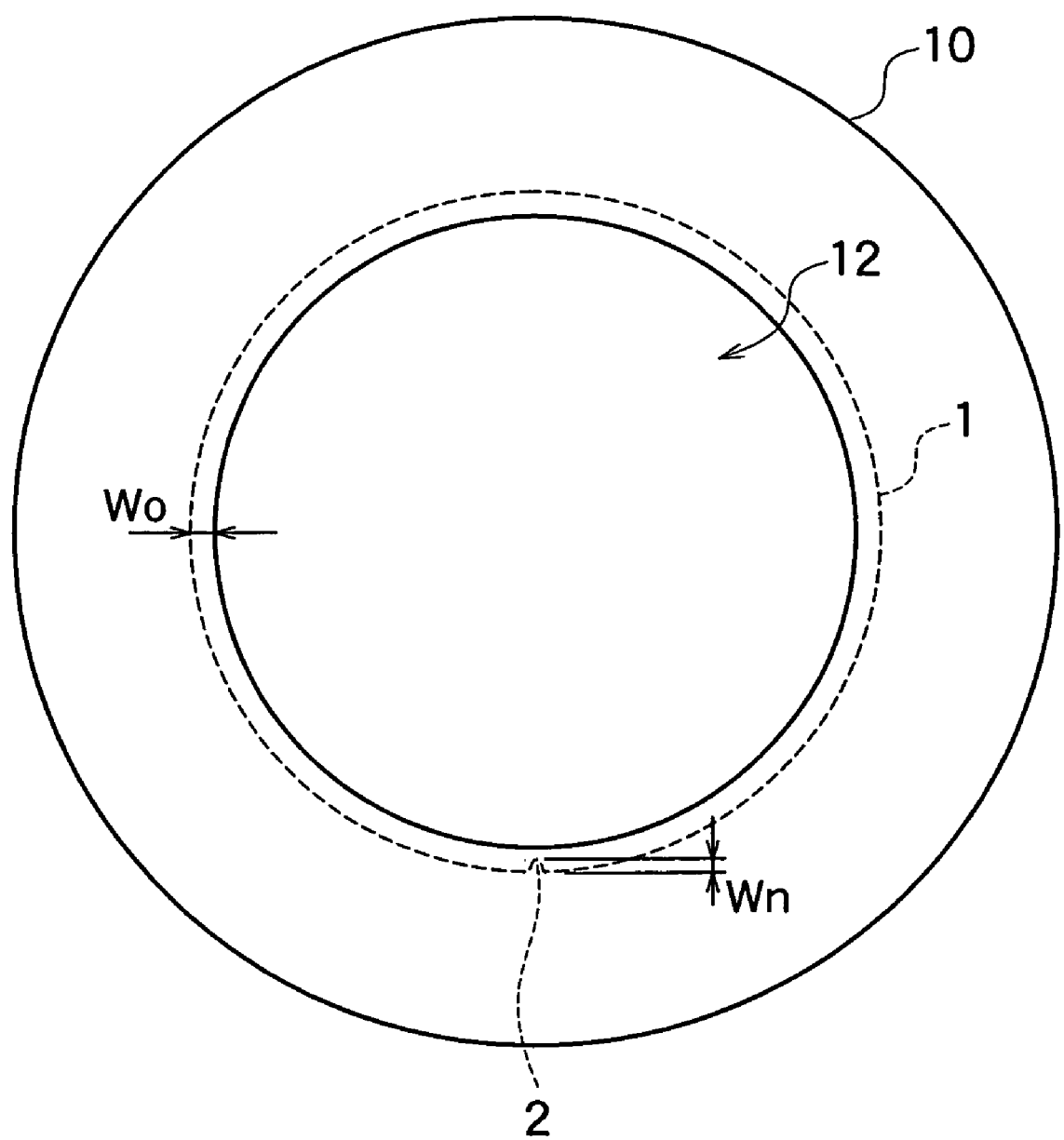
FIG. 4 is a diagram showing an example of a mask of an annealing apparatus according to the first embodiment of the present invention.

As shown in FIG. 4, an opening 12 is provided in a center of the mask 10 of the annealing apparatus according to the first embodiment of the present invention. The diameter of the opening 12 of the mask 10 is over 4 mm shorter than the diameter of the semiconductor substrate 1. For the sake of example, the diameter of the opening 12 of the mask 10 is 8 mm shorter than the diameter of the semiconductor substrate 1. The mask 10 is disposed in such a way as to selectively shield the flash lamp light from the light source 40 over a peripheral region width Wo that spans 4 mm from the outer edge of the semiconductor substrate 1 shown in FIG. 1. Also the peripheral region width Wo is provided larger than the width Wn (referred to as the notch width Wn hereinafter) of a notch 2. The notch 2 is provided on part of the outer edge of the semiconductor substrate 1 to indicate the crystal orientation. Metal such as aluminum (Al) or material such as silicon carbide (SiC) for instance is used as the mask 10 to shield light having a wavelength below 1 μm. The flash lamp light transmitted from the light source 40 passes through the opening 12 of the mask 10 and reaches an irradiation region of the surface of the semiconductor substrate 1, that corresponds to the opening 12. The peripheral region along the outer edge of the semiconductor substrate 1 is shielded from flash lamp light by the mask 10, and thus is not directly heated.

Figure 5:
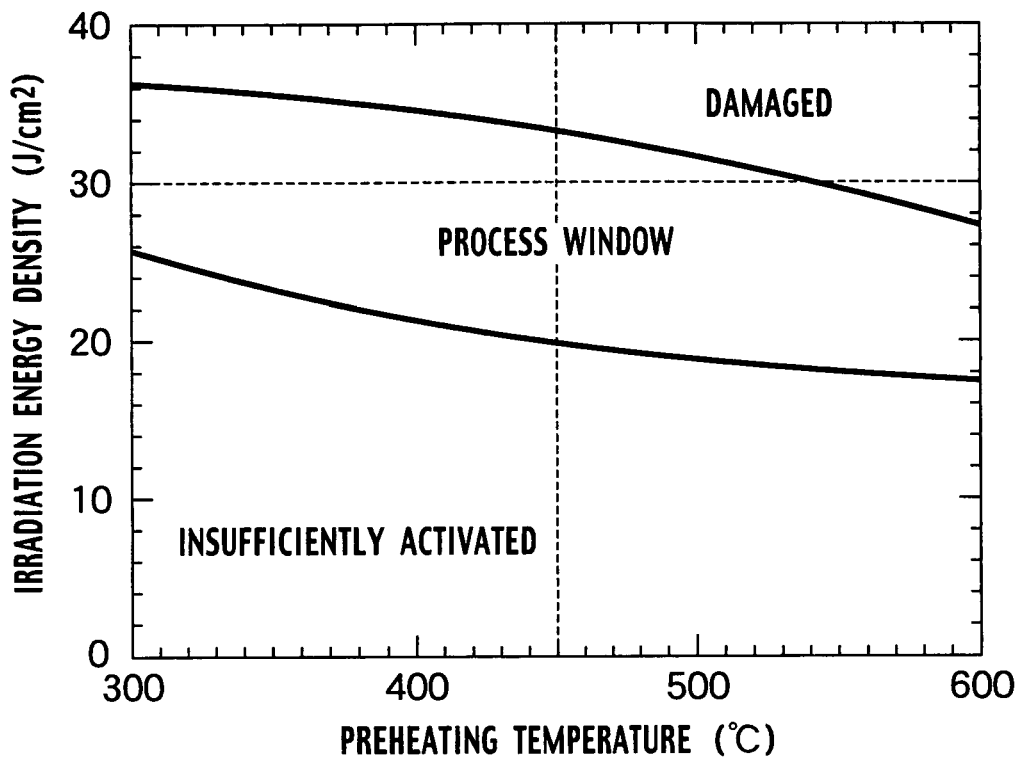
FIG. 5 is a diagram showing an example of a process window of irradiation energy density of an annealing apparatus according to the first embodiment of the present invention.

In activation annealing of the implanted impurities using the annealing apparatus according to the first embodiment, as shown in FIG. 5, in order to suppress damage and achieve a desirable activation rate, a process window of the irradiation energy density of flash lamp light depending on a pre-heating temperature of the semiconductor substrate 1 is provided. Stated plainly, when the irradiation energy density is below the lower limit of the process window, the activation of the impurities may be insufficient, making it impossible to form a low resistance layer. If the irradiation energy density is above the upper limit of the process window, damage will occur on the semiconductor substrate 1. For instance, regarding the pre-heating temperatures of 600° C. and 300° C. for the semiconductor substrate 1, the process windows of the irradiation energy density of flash lamp light are provided at approximately 18 $J/cm^2$ to 27 $J/cm^2$ and 26 $J/cm^2$ to 36 $J/cm^2$ respectively. The process window of the irradiation energy density is provided at approximately 20 $J/cm^2$ to 34 $J/cm^2$ at a pre-heating temperature of 450° C.

Figure 6:
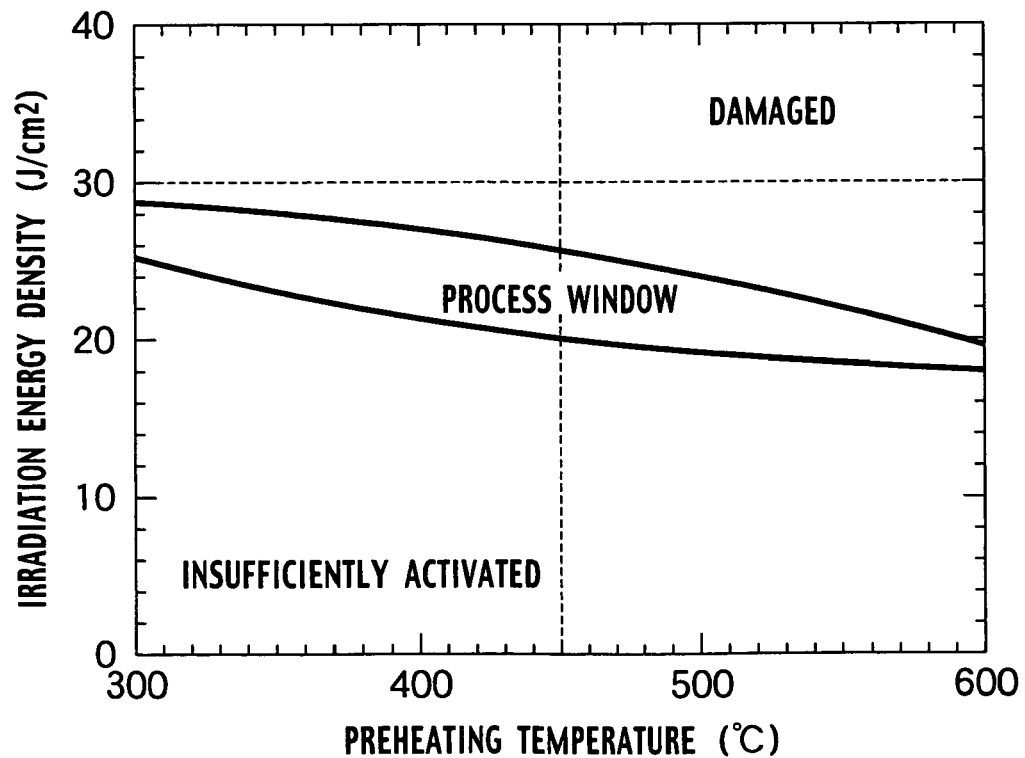
FIG. 6 is a diagram showing an example of a process window of irradiation energy density according to a comparative example.
Figure 7:
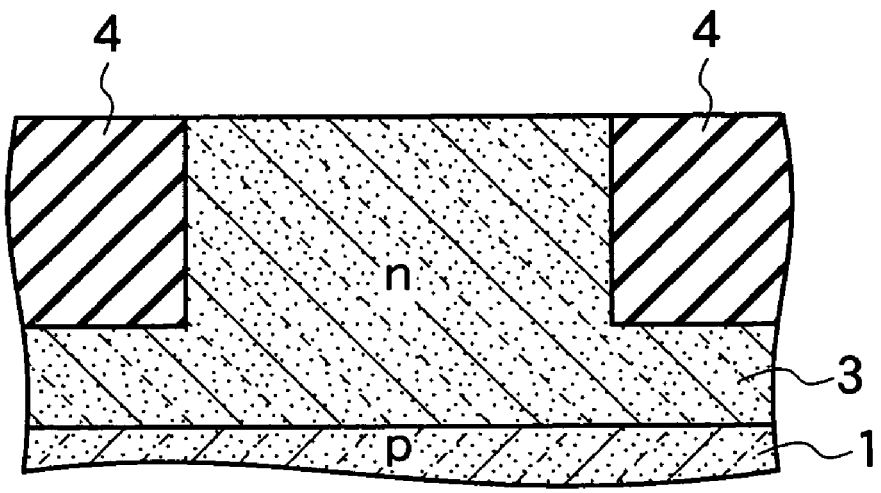
FIGS. 7 to 10 are cross section views showing an example of a manufacturing process of a semiconductor device used in a description of an annealing method according to the first embodiment of the present invention.

As a comparative example, activation annealing is performed without the mask 10 of the annealing apparatus shown in FIG. 1. On the comparative example, the mask 10 for shielding the outer edge of the semiconductor substrate 1 is not used, so that the flash lamp light heats the entire region including the outer edge of the semiconductor substrate 1. As a result, the semiconductor substrate 1 may be damaged by thermal stress on the outer region of the semiconductor substrate 1. In the comparative example, the lower limit of the process window is roughly the identical to the lower limit of the process window according to the first embodiment, as shown in FIG. 6. However, compared to the upper limit of the process window according to the first embodiment, the irradiation energy density of the upper limit of the process window of the comparative example is more than 7 $J/cm^2$ lower. Thus, the process window of the comparative example shrinks to less than ½.

In the annealing apparatus according to the first embodiment, the mask 10 is used. The peripheral region along the outer edge of the semiconductor substrate 1, that has the peripheral region width Wo from the outer edge of the semiconductor substrate 1, is shielded from flash lamp light by the mask 10. Thus, the outer edge of the semiconductor substrate 1 is not directly heated. Therefore, crystal defects that would occur on the peripheral region along the outer edge of the semiconductor substrate 1 are suppressed and the cracking resistance of the semiconductor substrate 1 is improved.

Next, an annealing method and a semiconductor manufacturing method according to the first embodiment will be described using a manufacturing process of a p-MOS transistor as an example. Further, the semiconductor device is not limited to a p-MOS transistor. A semiconductor device such as an n-MOS transistor and a complementary MOS (CMOS) transistor for instance are also acceptable. Additionally, a metal-insulator-semiconductor (MIS) transistor using an insulating film such as a silicon oxynitride (SiON) film, a silicon nitride ($Si_3N_4$) film, or a composite insulating film between an $SiO_2$ film and an SiON film, an $Si_3N_4$ film, a various metal oxide film or the like, instead of the silicon oxide ($SiO_2$) film, is also acceptable.

Ions of the group V element such as As for instance, as n-type impurities are implanted into the semiconductor substrate 1 of p-type Si, to form an n-well 3, so as to provide an intermediate product of a p-MOS transistor. On the periphery of the n-well 3, trenches are formed using photolithography, reactive ion etching (RIE), and the like. Using a process such as low pressure chemical vapor deposition (LPCVD) for instance, an insulating film of a substance such as $SiO_2$ is deposited so as to bury the trenches. Afterward, the insulating film deposited on the surface of the n-well 3 of the intermediate product is removed using a chemical mechanical polishing (CMP) process for instance, forming shallow trench isolations (STIs) 4. An element region is formed in between the STIs 4.

Figure 8:
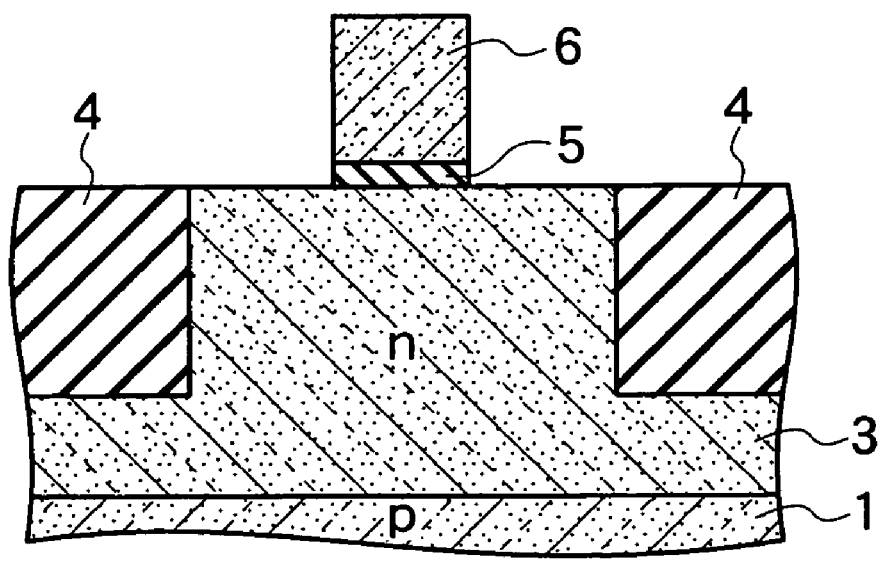

An insulating film such as a thermally oxidized film is formed on the surface of the element region of the intermediate product. A polycrystalline Si (poly-Si) film is deposited on top of the insulating film using an LPCVD process for instance. Part of the poly-Si film and the insulating film are selectively etched away using photolithography, RIE, and the like, forming a gate electrode 6 and a gate insulating film 5, as shown in FIG. 8.

Figure 9:
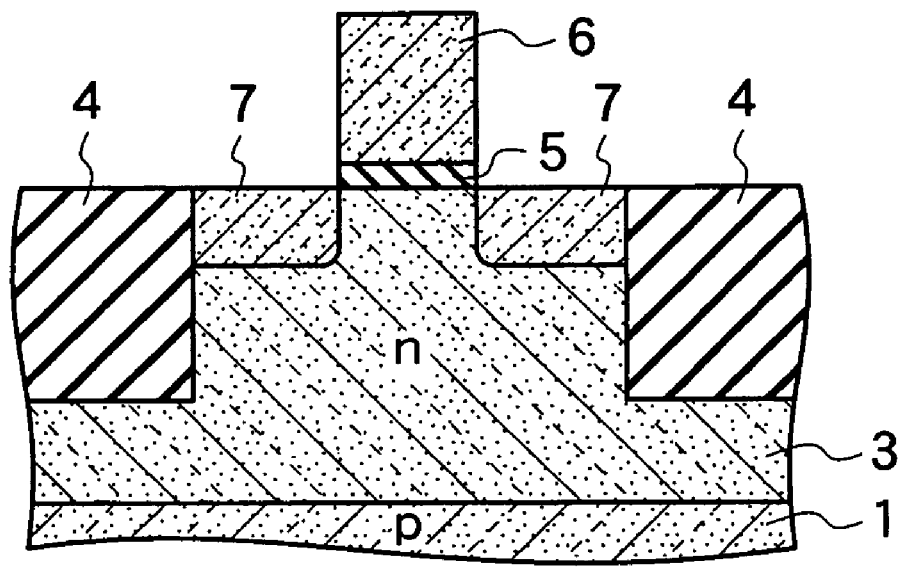

Using the gate electrode 6 as a mask, an ion implantation process for an active layer (a first process) is implemented. Ions of the group III element such as B, as the p type impurities are implanted to the exposed surface of the intermediate product. For instance, B ion implantation conditions are an acceleration energy of 0.2 keV, and an implant dose of $1 \times 10^{15}$ $cm^{-2}$. As a result, ion implanted layers 7 having a depth of approximately 15 nm from the surface of the intermediate product are formed in between the gate insulating film 5 and the STIs 4, as shown in FIG. 9.

Figure 10:
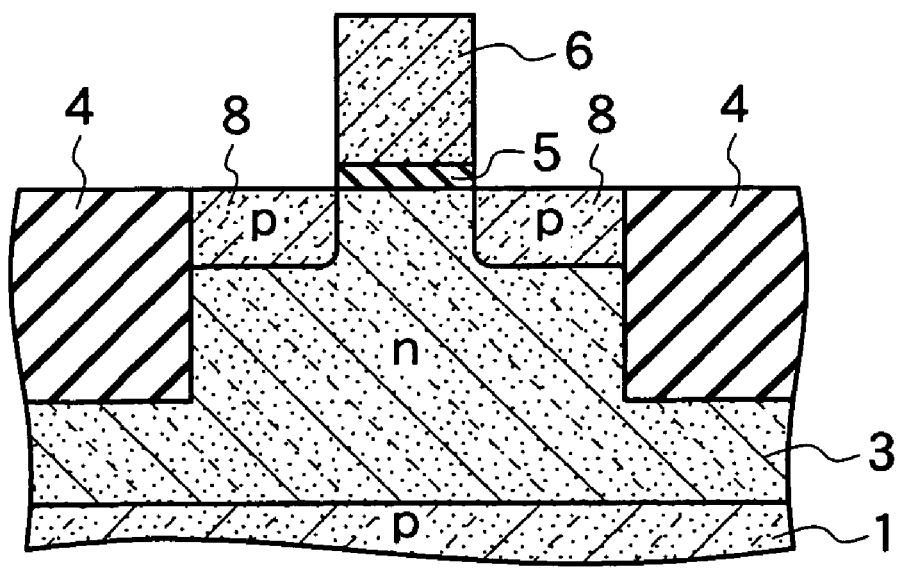

The intermediate product is placed on top of the substrate stage 31 of the annealing apparatus shown in FIG. 1. In the activation annealing process, the substrate stage 31 is pre-heated to 450° C., for example, from the bottom surface of the intermediate product by the heating source 41. The surface of the intermediate product is irradiated with flash lamp light from the light source 40 under conditions of a pulse width of 1 ms, and irradiation energy density of 30 $J/cm^2$, while maintaining the pre-heating temperature of 450° C. By activation annealing, the B ions implanted into the ion implanted layers 7 reside substitutional lattice sites to be activated. As a result, p-type active layers 8 is formed in between the gate insulating film 5 and the STIs 4, as shown in FIG. 10.

An interlevel insulating film of $SiO_2$ for example, is deposited on the surface of the intermediate product in a formation process of an interlevel insulating film (a second process). Next, each contact holes is opened on the interlevel insulating film on top of the gate electrode 6 and the p-type active layers 8 corresponding to source/drain regions. Wirings are connected to both the gate electrode 6 and the p-type active layers 8 through each of the contact holes. Thus, a semiconductor device is manufactured.

In the annealing method according to the first embodiment, the impurities implanted to the ion implanted layers 7 formed at the ion implantation process are activated with an irradiation energy density that is sufficient enough to achieve a desired activation rate. Additionally, by using the mask 10 in the activation annealing, the outer edge of the semiconductor substrate 1 is shielded from the flash lamp light by the mask 10 over the peripheral region width Wo, to be not directly heated. As a result, crystal defects that occur on the semiconductor substrate 1 are suppressed and it becomes possible to form a shallow pn junction. According to the first embodiment, it becomes possible to improve the cracking resistance of the semiconductor substrate 1 while manufacturing a semiconductor device at a high yield.

In the above-mentioned description, the opening 12 is provided in such a way that the mask 10 selectively shields the flash lamp light from the light source 40 over a peripheral region width Wo that spans by 4 mm from the outer edge of the semiconductor substrate 1. However, the peripheral region width Wo is not limited to 4 mm. The peripheral region width Wo can be in a range of from 2 mm to 10 mm. When the peripheral region width Wo is less than 2 mm, the peripheral region width Wo will be about the same as the notch width Wn of the notch 2, which makes it very easy for damage to occur in the proximity of the notch 2. If the peripheral region width Wo exceeds 10 mm, although there is improvement on the cracking resistance of the semiconductor substrate 1, the irradiation region will be narrowly restricted. As a result the number of semiconductor device chips that can be provided on the surface of the semiconductor substrate 1 will be limited, which will affect production yield.

On the annealing apparatus according to the first embodiment, the mask 10 is disposed in between the transparent window 38 and the semiconductor substrate 1, as shown in FIG. 1. However, it is acceptable where the mask 10 is merely placed anywhere between the light source 40 and the semiconductor substrate 1. For example, it is also acceptable to place the mask 10 in between the light source 40 and the transparent window 38, as shown in FIG. 11.

In the above-mentioned description, a light shielding film is used for the mask 10. However, the material of the mask 10 is not limited to a light shielding film. For instance, it can be affirmed that the same technological advantages as a light shielding film can be attained with a material that has a light reduction rate of more than 0.2 by absorbing, reflecting, and scattering of light components including the peak wavelength, for example a wavelength below 1 μm, of the light transmitted from the light source 40.

It is possible to use, for example, a neutral density (ND) filter as the light reducing material. Also, when a light shielding film of metal such as chromium (Cr) and metallic compound such as chromium oxide (CrO) is deposited at a thickness of less than 500 nm, it becomes possible to adjust the rate of light transmission. It is acceptable to perform patterning on the light shielding film formed on top of a transparent substrate such as synthetic quarts. It is also acceptable to use a light absorbing film of a material such as poly-Si as the light reduction material. Further, it is acceptable to adjust the rate of light transmission by substituting a light reducing material with a frosted surface of a transparent substrate. For example, a part of the surface region of the transparent window 38 shown in FIG. 1, is frosted so as to scatter over 20% of light in a wavelength of or below 1 μm. In this instance, a transparent member 138 having a diameter of from approximately 4 mm to 20 mm shorter than the diameter of the semiconductor substrate 1 is provided on a surface of the a transparent window 38a. On the periphery surrounding the transparent member 138, a mask 100 having a frosted surface is provided.

SECOND EMBODIMENT

Figure 13:
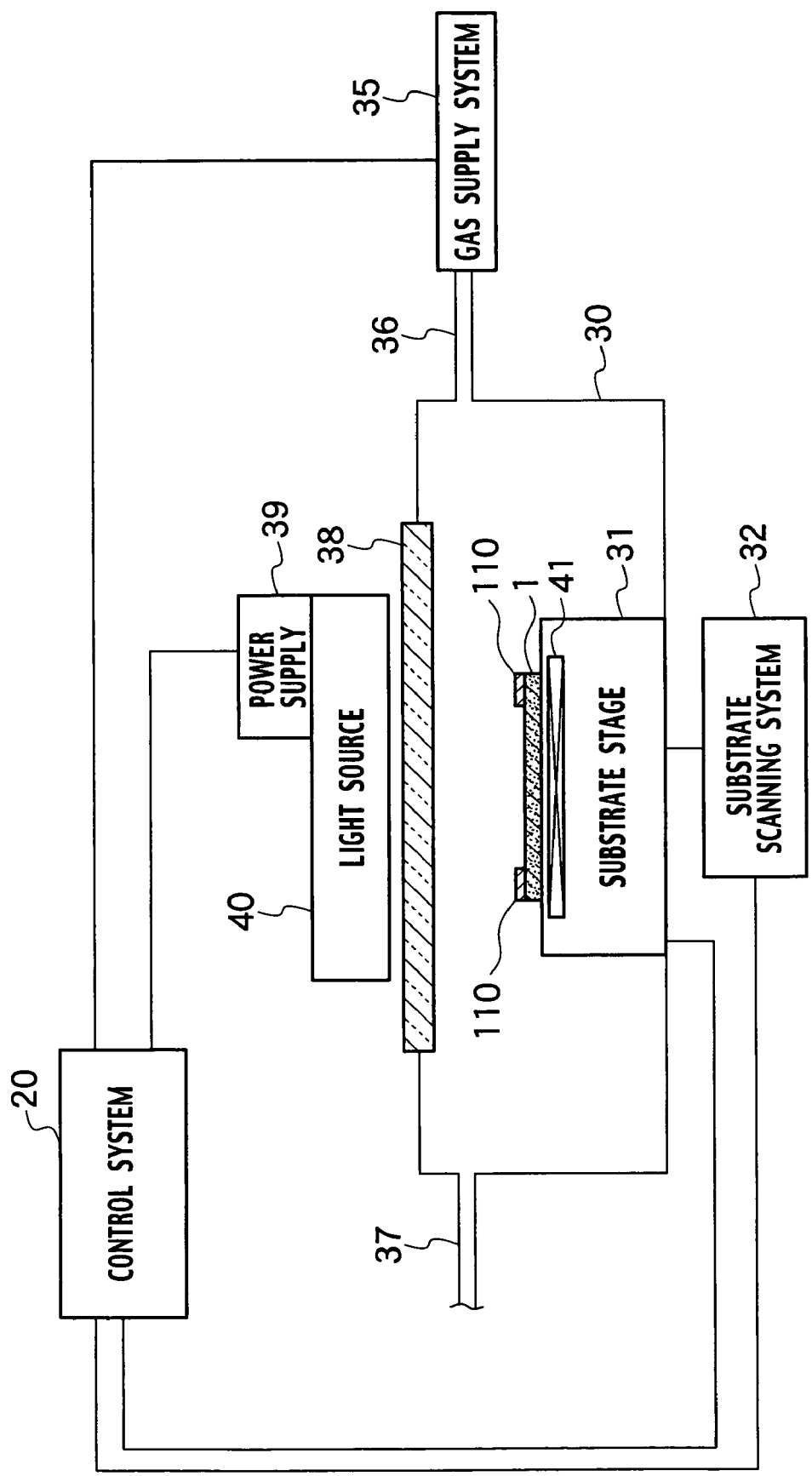
FIG. 13 is a schematic view showing an example of an annealing apparatus according to a second embodiment of the present invention.
Figure 14:
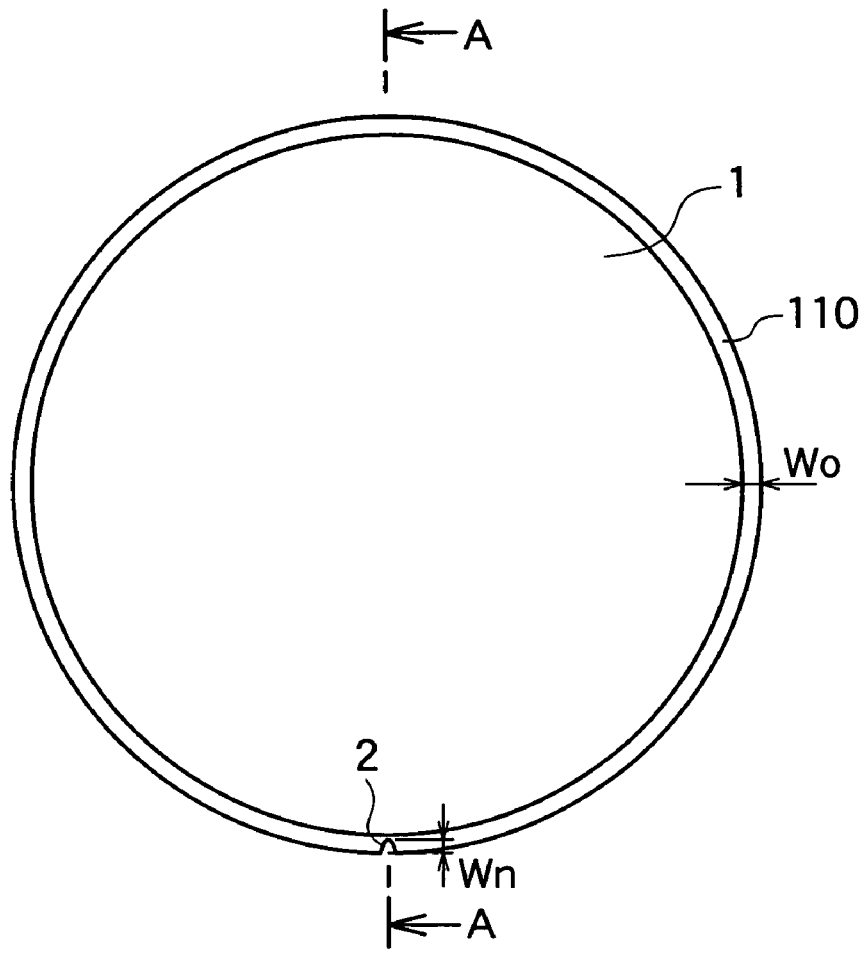
FIG. 14 is a diagram showing an example of a mask according to the second embodiment of the present invention.

In an annealing apparatus according to a second embodiment of the present invention, a mask 110 is provided on the peripheral region of the surface of the semiconductor substrate 1, as shown in FIG. 13. A flash lamp light from the light source 40 is irradiated on the entire surface of the semiconductor substrate 1 having the mask 110. A peripheral region width Wo on which the mask 110 is formed is provided wider than a notch width Wn of a notch 2, as shown in FIG. 14. It is possible to use a light reducing material having a rate of light transmission of below 80%, and a highly reflective metallic film such as Al, silver (Ag), rhodium (Rh), nickel (Ni), platinum (Pt), antimony (Sb), as the mask 110. By the mask 110, the flash lamp light is selectively shielded, or reduced in intensity by over 20% in the peripheral region along the outer edge of the semiconductor substrate 1. Thus, it becomes possible to suppress damage that occurs on the semiconductor substrate 1, and improve the cracking resistance of the semiconductor substrate 1. In the second embodiment, the aspect in which the flash lamp light from the light source 40 is selectively reduced in intensity or shielded by the mask 110 formed on the surface of the semiconductor substrate 1 differs with the first embodiment. Other configurations are identical to the first embodiment. Thus, redundant description will be omitted.

Figure 15:
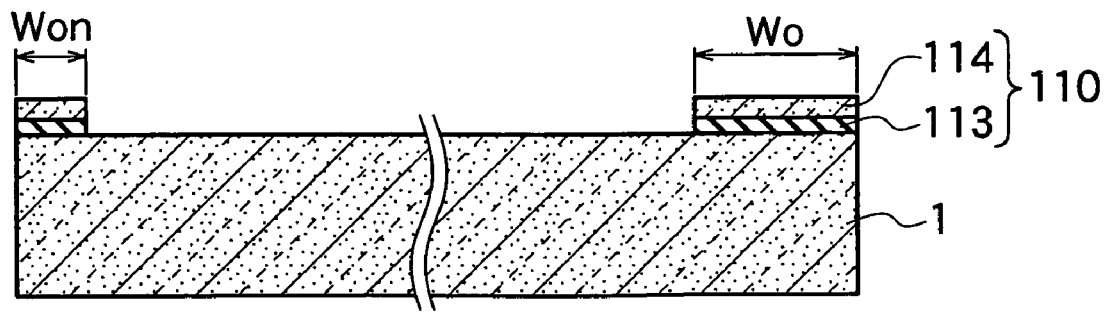
FIG. 15 is a diagram showing an example of cross section of the mask along A—A line shown in FIG. 14.

A multilayer film having an insulating film 113 of $SiO_2$, which serves as a buffer on top of the semiconductor substrate 1, and a light absorbing film 114 of a material such as poly-Si deposited on top, will be used to describe the mask 110, as shown in FIG. 15. In the multilayer film having a $SiO_2$ film and a poly-Si film each having a thickness of approximately 300 nm, an intensity of thermal energy reaching the semiconductor substrate 1 can be reduced by half. For example, the mask 110, which has the insulating film 113 and the light absorbing film 114 deposited with a thickness of 300 nm respectively, can be formed from the outer edge of the semiconductor substrate 1 to a peripheral region width Wo of 3 mm. The peripheral region width Won at the notch 2 is approximately 1 mm, for example.

Figure 16:
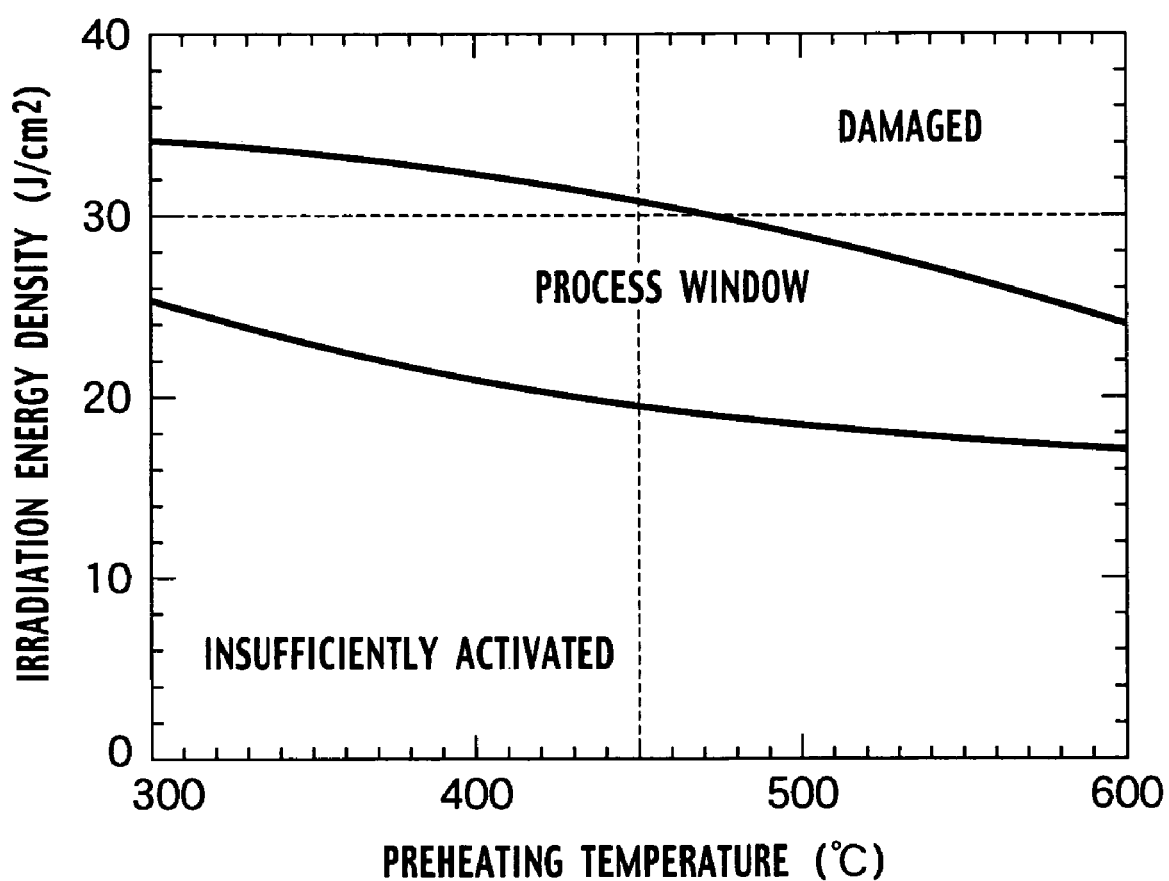
FIG. 16 is a diagram showing an example of a process window of irradiation energy density of the annealing apparatus according to the second embodiment of the present invention.

With the mask 110 formed on the peripheral region along the outer edge of the semiconductor substrate 1, a process window of the irradiation energy density can be provided, as shown in FIG. 16. A lower limit of the process window according to the second embodiment is roughly the same as the lower limit of the process window of the comparative example shown in FIG. 6. However, an upper limit of the process window according to the second embodiment is approximately 24 $J/cm^2$ to 34 $J/cm^2$ higher than the comparative example, in regard to the pre-heating temperature of from 300° C. to 600° C. Thus, by the annealing method according to the second embodiment, it is possible to improve the cracking resistance of the semiconductor substrate 1.

The uniformity of the annealing temperature on the surface of the semiconductor substrate 1 improves in relation to the irradiation region of the semiconductor substrate 1 becoming wider than the chip region onto which semiconductor devices are fabricated. In the second embodiment, it is possible to form the mask 110 on the peripheral region, which defines an irradiation region of each different semiconductor device manufactured on a plurality of the semiconductor substrate 1. Therefore, according to the second embodiment it becomes possible to implement annealing without any deterioration on the uniformity of the annealing temperature on the surface of the semiconductor substrate 1.

THIRD EMBODIMENT

Figure 17:
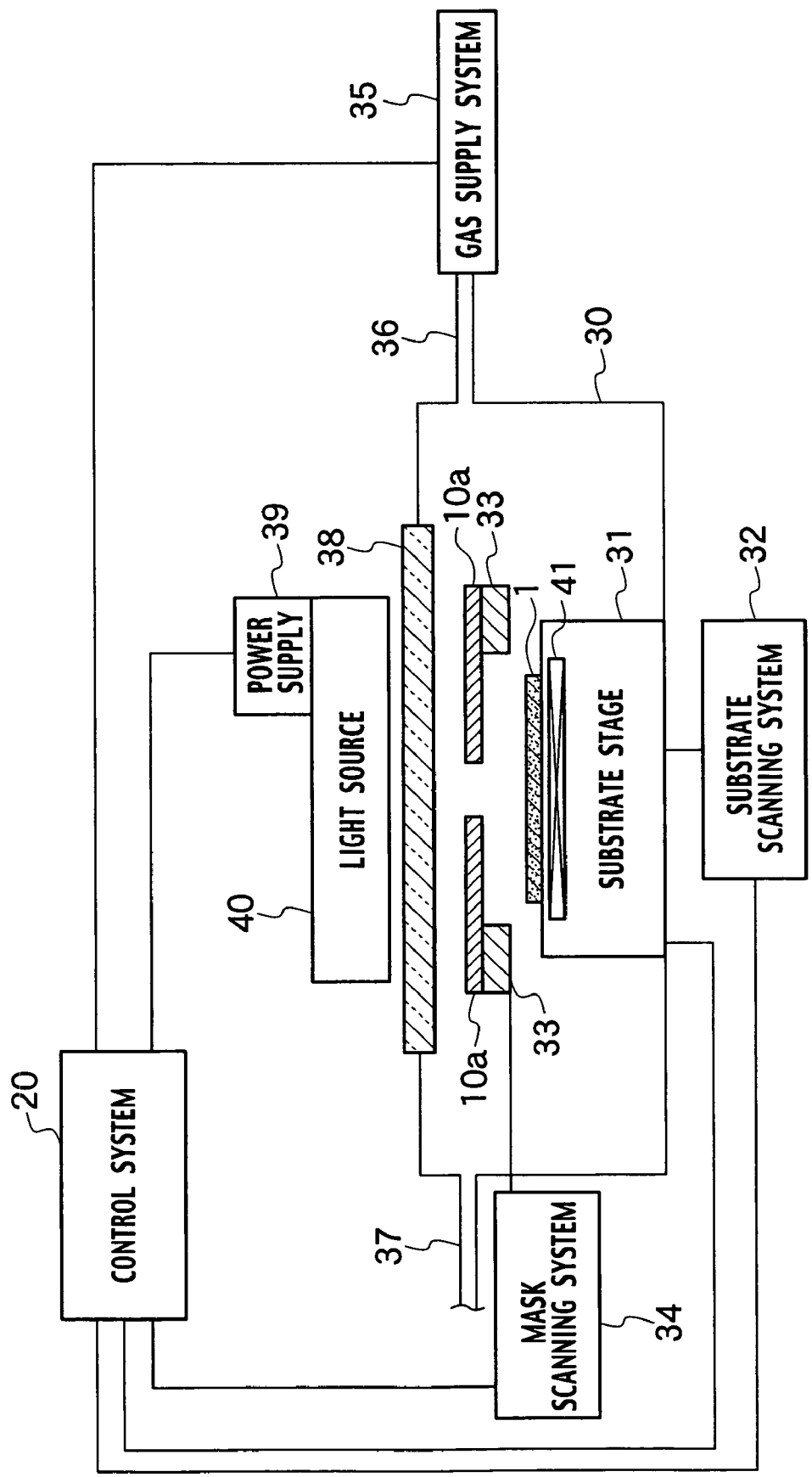
FIG. 17 is a schematic view showing an example of an annealing apparatus according to a third embodiment of the present invention.
Figure 18:
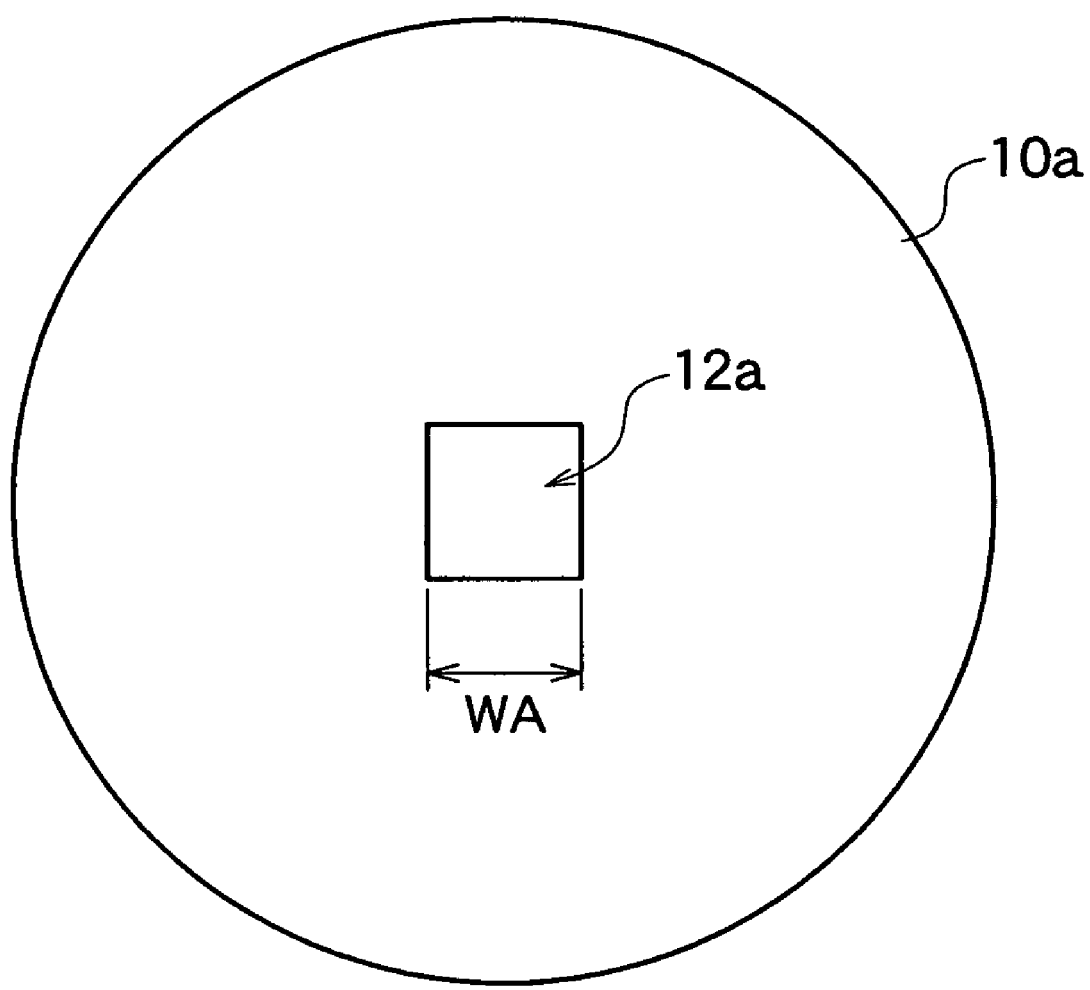
FIG. 18 is a diagram showing an example of a mask according to the third embodiment of the present invention.

In an annealing apparatus according to the third embodiment of the present invention, a mask 10a is placed on the mask stage 33, as shown in FIG. 17. An rectangular-shaped opening 12a having an opening width WA is provided on the mask 10a, as shown in FIG. 18. Metal such as Al or material that shields light in a wavelength below 1 μm such as SiC is used as the mask 10a. The mask 10a is disposed in such a way that the irradiation region corresponding to the opening 12a is located within the outer edge of the semiconductor substrate 1. The peripheral region along the outer edge of the semiconductor substrate 1 is not irradiated by a flash lamp light. Thus, it becomes possible to suppress damage that occurs on the semiconductor substrate 1, and improve the cracking resistance of the semiconductor substrate 1. In the third embodiment, the aspect in which the mask 10 having the rectangular-shaped opening 12a is used differs with the first embodiment. Other configurations of the third embodiment are identical to the first embodiment. Thus, redundant description will be omitted.

Figure 19:
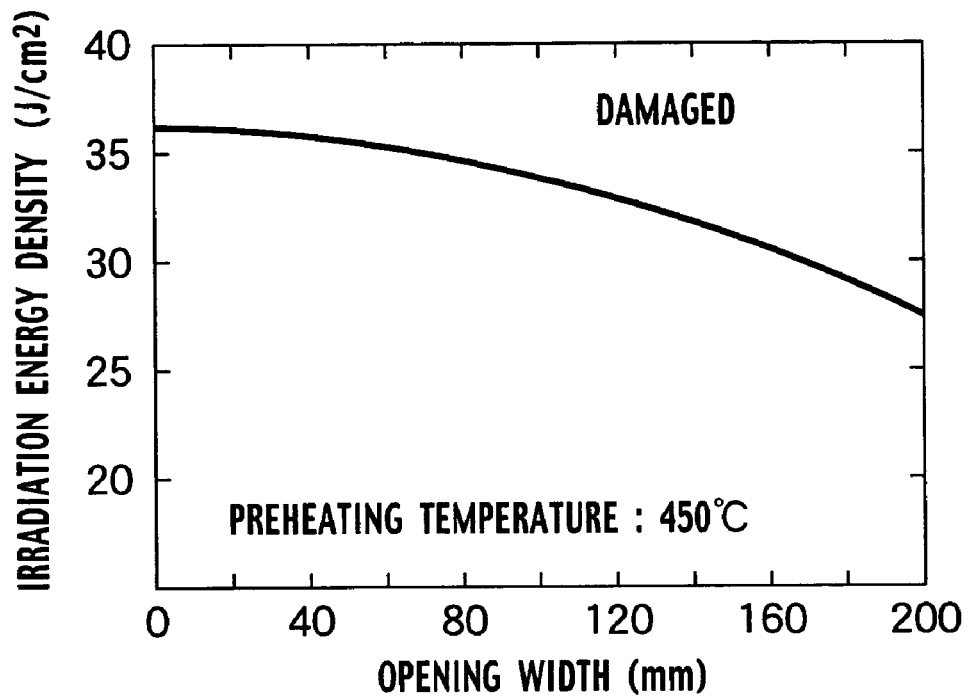
FIG. 19 is a diagram showing an example of the relationship between the irradiation energy density and the irradiation zone in regard to damage caused by the annealing apparatus according to the third embodiment of the present invention.
Figure 20:
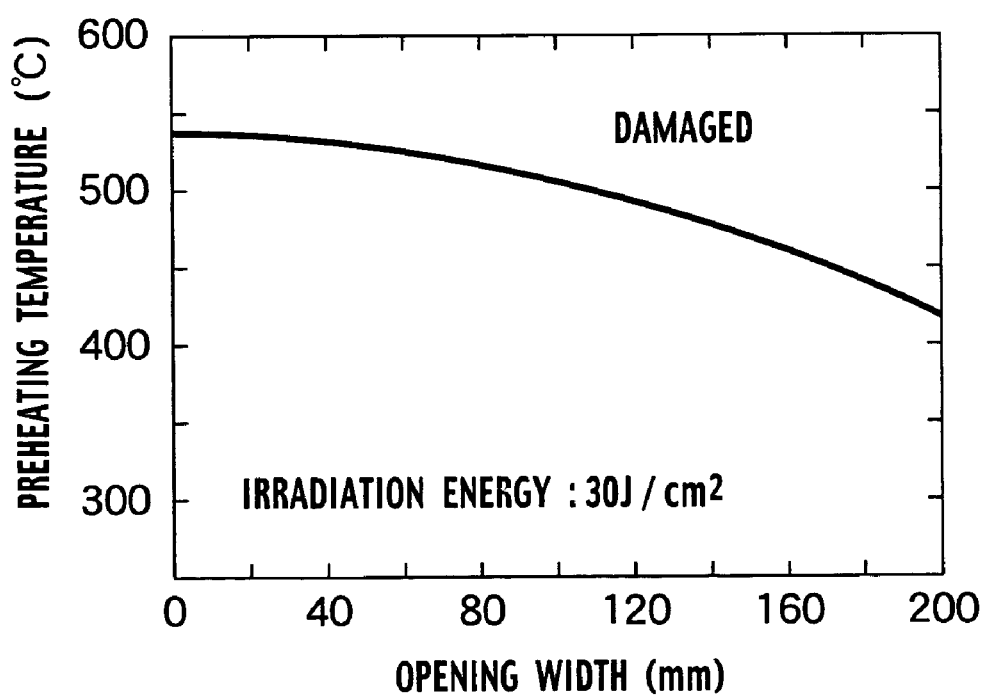
FIG. 20 a diagram showing an example of the relationship between pre-heating temperature and the irradiation zone in regard to the damage caused by the annealing apparatus according to the third embodiment of the present invention.

For instance, ion implanted impurities into the semiconductor substrate 1 of Si having a diameter of 200 mm are annealed for activation by the annealing apparatus of FIG. 17. A relationship between the opening width WA of the opening 12a of the mask 10a and a process window, corresponding to the generation of damage on the semiconductor substrate 1 is shown in FIGS. 19 and 20. The smaller the opening width WA, the more the damage resistance of the semiconductor substrate 1 related to irradiation energy density and pre-heating temperature will improve.

By the flash lamp light, only surface layer from the surface of the semiconductor substrate 1 to a depth of several tens μm will be partially heated. Thus, a precipitous thermal difference of 300° C. to 1000° C. occurs in between the top and bottom surfaces of the semiconductor substrate 1. For instance, by irradiating the entire surface of the semiconductor substrate 1 with a 200 mm diameter, the surface layer thus heated to 1300° C. Because the thermal expansion rate of Si crystal is approximately $3\times10^{-6}$ $K^{-1}$, the Si crystal of the heated surface layer will expand approximately 1 mm in the direction parallel to the level surface. In the full surface irradiating method that does not limit the irradiation regions at the surface of the semiconductor substrate 1, the difference in thermal expansion of the Si crystal between the heated surface layer and the unheated bottom layer is large. As a result the thermal stress in the interior of the semiconductor substrate 1 increases to exceed the brittle fracture critical point of the Si crystal causing damage on the semiconductor substrate 1.

On the other hand, when the mask 10a according to the third embodiment is used, the irradiation region at the surface of the semiconductor substrate 1 is roughly the same size as the opening width WA of the opening 12a. For example, when the opening width WA of the opening 12a is 20 mm to restrict the irradiation region at the surface of the semiconductor substrate 1, the thermal expansion of the heated Si crystal of the surface layer can be suppressed by up to approximately 0.1 mm. Thus, since the thermal stress to the semiconductor substrate 1 is suppressed, it is possible to improve the cracking resistance of the semiconductor substrate 1 and to prevent damage to the semiconductor substrate 1. Thus, according to the third embodiment, the manufacture of a semiconductor device can be achieved, where the generation of crystal defects such as slips and dislocations is suppressed.

In the third embodiment, the irradiation region of the surface of the semiconductor substrate 1 is restricted by the opening 12a of the mask 10a. In order to scan the entire irradiation region of the semiconductor substrate 1, the substrate scanning system 32 is controlled by the control system 20 to successively move the substrate stage 31. With each successive movement of the substrate stage 31, the flash lamp light of the light source 40 is irradiated. In this manner, the entire irradiation region of the semiconductor substrate 1 can be annealed. Further, the substrate stage 31 moves successively through out the scanning of the entire irradiation region of the semiconductor substrate 1. However, it is obvious for the control system 20 to control the mask scanning system 34 so as to successively move the mask 10a placed on top of the mask stage 33.

For example, a plurality of chip regions 51a, 51b, 51c, . . . , 51d of a semiconductor device are provided on top of the semiconductor substrate 1. The chip regions 51a, 51b, 51c, . . . , 51d have dimensions of 20 mm×20 mm. Ions of p-ype impurity B are implanted to each of the chip regions 51a, 51b, 51c, . . . , 51d at an energy acceleration of 0.5 keV and a implant dose of $1\times10^{15}$ $cm^{-2}$. Afterward, the semiconductor substrate 1 is placed on the substrate stage 31 of the annealing apparatus shown in FIG. 17. The opening width WA of the opening 12a of the mask 10a, like the dimensions of the chip regions 51a, 51b, 51c, . . . , 51d, is 20 mm×20 mm.

The activation annealing process is controlled by the control system 20. First of all the semiconductor substrate 1 is pre-heated to 450° C. by the heating source 41. The substrate stage 31 is successively moved by the substrate scanning system 32, and each of the chip regions 51a, 51b, 51c, . . . , 51d are heated by the flash lamp light of the light source 40 through the opening 12a. The irradiation energy density of the flash lamp light of the light source 40 is 24 J/cm², and the pulse width is 1 m seconds. After activation annealing, measurement of the electrical properties at each of the chip regions 51a, 51b, 51c, . . . 51d is implemented. By the annealing method according to the third embodiment, the standard deviation σ of the in-plane distribution of the semiconductor substrate 1 of sheet resistance is approximately 1%.

As a comparative example, activation annealing by a full field irradiation with the flash lamp light of the light source 40 without the mask 10a is implemented, in regard to a plurality of chip regions of a semiconductor substrate that has been ion implanted under implant conditions identical to those in the third embodiment. Here, a "full field" irradiation is defined as a light irradiation of the entire surface of the semiconductor substrate 1 all at once. The activation annealing conditions are also identical to those in the third embodiment. The standard deviation σ of the in-plane distribution of sheet resistance is approximately 5%.

Figure 22:
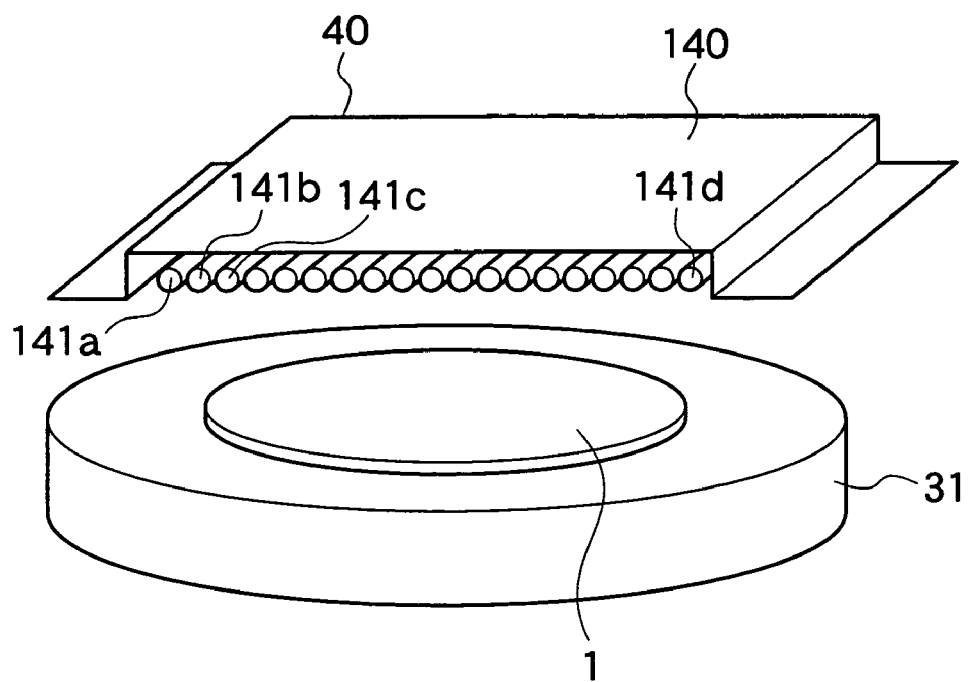
FIG. 22 is a diagram showing an example of a light source of the annealing apparatus according to the third embodiment of the present invention.

The light source 40 has tubular-shaped lamp elements 141a, 141b, 141c, . . . , 141d aligned within the direction facing the substrate stage 31, and a lamp housing that stores the lamp elements 141a, 141b, 141c, . . . , 141d, as shown in FIG. 22. In addition, in the FIG. 22, illustration of structural members besides the light source 40 and the substrate stage 31 has been omitted. In a case in which annealing is implemented to a semiconductor substrate 1 that has a large surface area of a diameter of 200 mm or 300 mm for instance, by the full field irradiation of the flash lamp light, the irradiation region of the semiconductor substrate 1 is heated by the flash lamp light transmitted from the plurality of lamp elements 141a, 141b, 141c, . . . , 141d disposed directly above and around the semiconductor substrate 1. In the center of the semiconductor substrate 1 compared to the outer edge of the semiconductor substrate 1, the irradiation energy density is substantially higher. In the case of the full field irradiation, it becomes easy for the irradiation energy density to vary according to geometrical factors such as shapes and arrangements of the lamp elements 141a, 141b, 141c, . . . , 141d of the light source 40.

Additionally, in the full field irradiation without the mask 10a, when the irradiation energy density is raised to 27 J/cm², the standard deviation σ of the in-plane distribution of sheet resistance may improve by approximately 2%. By raising the irradiation energy density, the activation rate of B on the outer side of the semiconductor substrate 1 increases, and in addition, the activation rate of B in the center area of the semiconductor substrate 1 starts saturating. Further, when the irradiation energy density is raised to near 30 J/cm² in order to improve the in-plane uniformity, slips may occur in the semiconductor substrate 1. Additionally, with an irradiation energy density of above 30 J/cm², the semiconductor substrate 1 may be cracked. Thus, with the full field irradiation method of the flash lamp light, the improvement of in-plane uniformity by adjusting the annealing conditions will be insufficient because the process window of the irradiation energy density is narrow.

In the third embodiment, the irradiation energy density is supplied through the opening 12a of the mask 10a. Therefore, it is possible to decrease a variation of the irradiation energy density, which is caused by the geometrical factors of the light source 40. Thus, the variation of the irradiation energy density caused by the light source 40 can be suppressed, and improvement of a production yield and the stability of an annealing process may be achieved.

Figure 21:
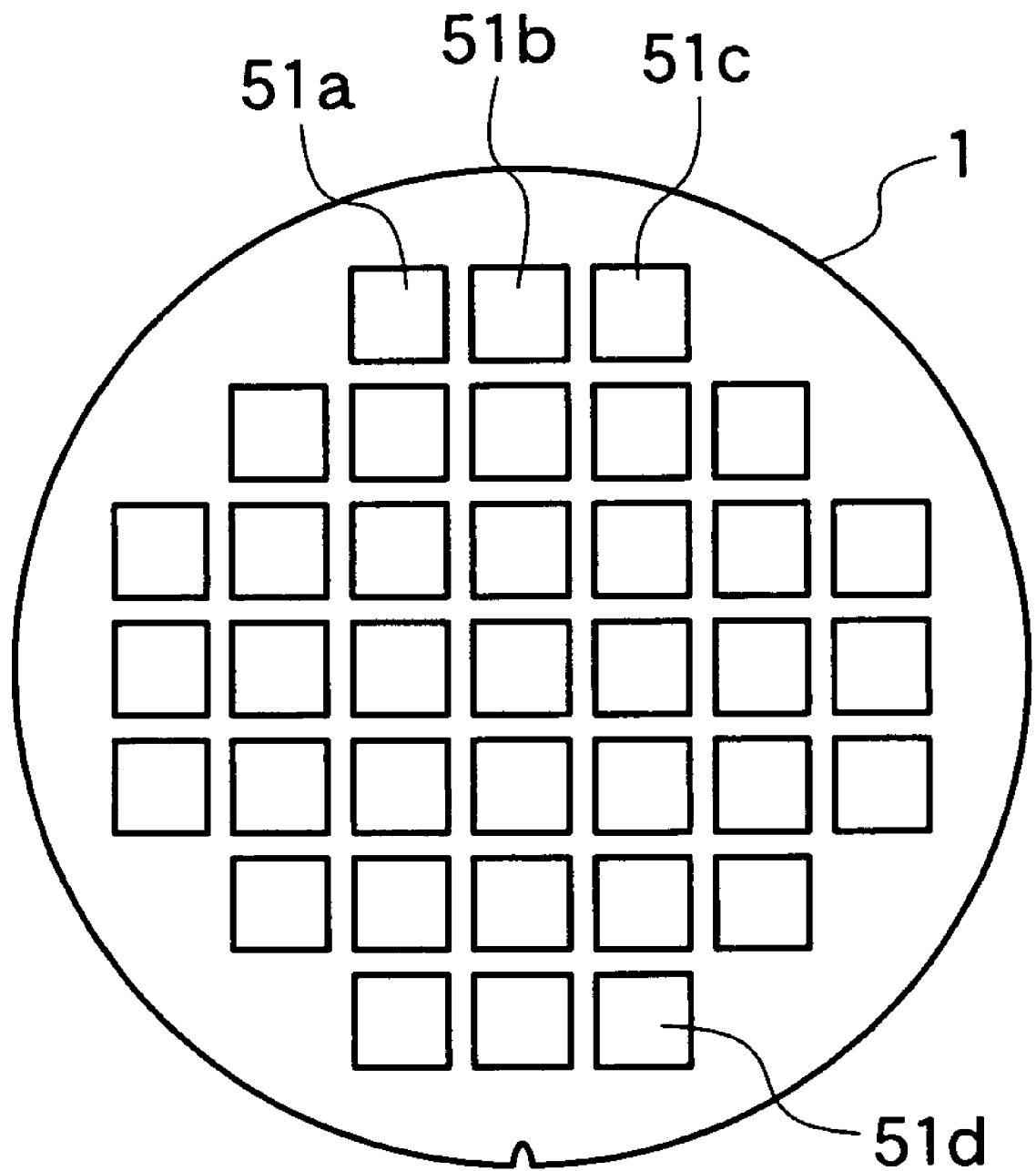
FIG. 21 is a diagram showing an example of a semiconductor substrate used in the description of an annealing method according to the third embodiment of the present invention.
Figure 23:
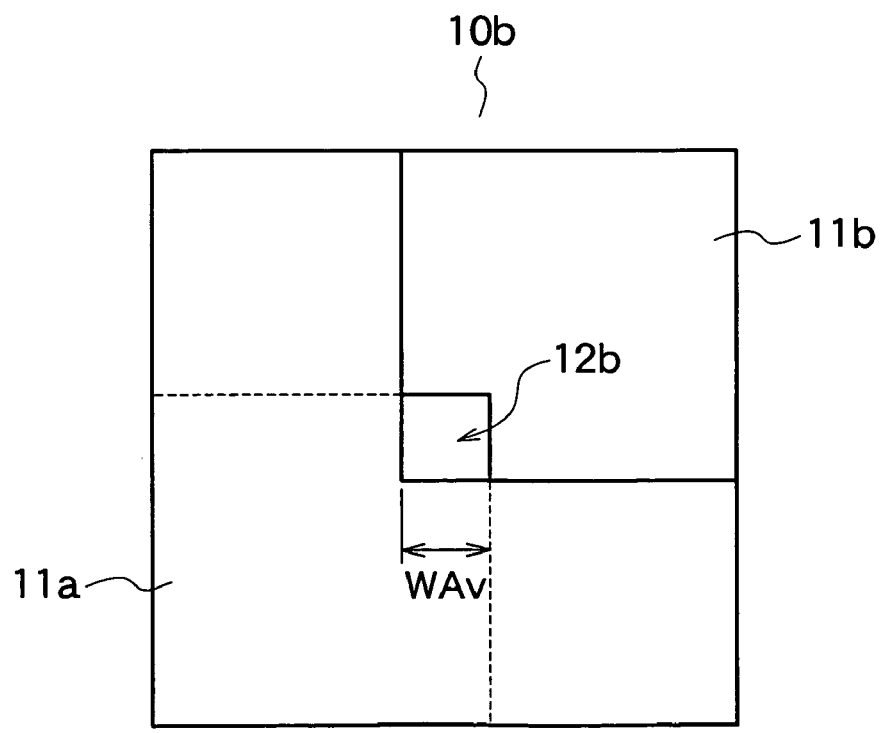
FIG. 23 is a diagram showing another example of a mask according to the third embodiment of the present invention.

For example, the chip regions 51a through 51d shown in FIG. 21 vary depending on the particular semiconductor device being manufactured. It is acceptable to use a mask 10b shown in FIG. 23 in order to match the irradiation region with the chip region provided on the semiconductor substrate 1. For the mask 10b, L-shaped movable members 11a and 11b, which are composed of a light shielding material, are combined to provide the opening 12b. The opening width Wav of the opening 12b can be changed by adjusting the movable members 11a and 11b. Thus, by using the mask 10b, the irradiation region can be set to match an arbitrary chip region, and a high improvement in the efficiency of the annealing process may be achieved.

Figure 24:
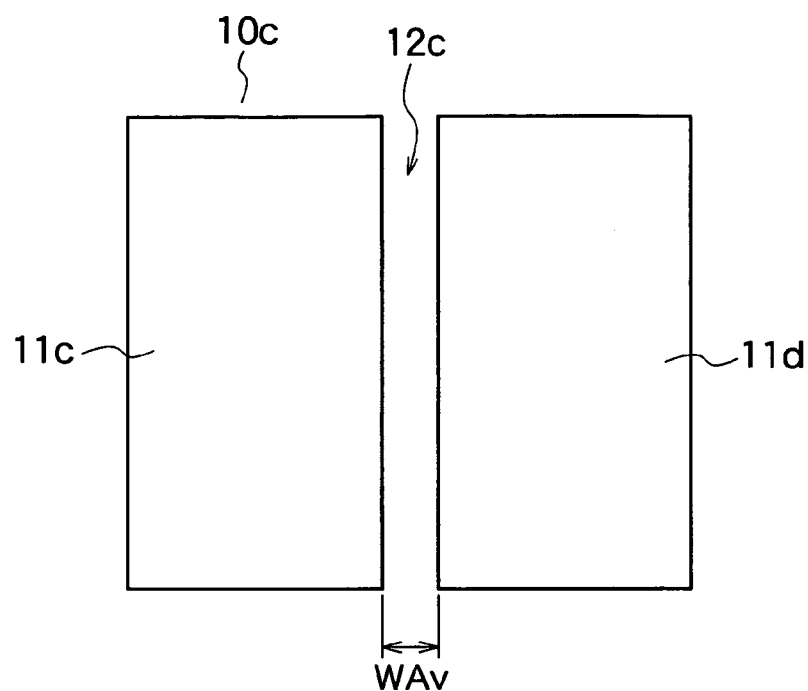
FIG. 24 is a diagram showing yet another example of a mask according to the third embodiment of the present invention.

Additionally, in a mask 10c, rectangular-shaped movable members 11c and 11d, which are composed of a light shielding material, are separated to provide an opening 12c, as shown in FIG. 24. The opening width Wav of the opening 12c can be changed by adjusting the movable members 11c and 11d. For the mask 10c, the irradiation region corresponds to the chip regions aligned in one direction, for example. When using the mask 10c, because the outer edge of the semiconductor substrate 1 is included in the irradiation region, it is desirable to combine use of a different mask such as the mask 10 and the mask 110 provided as examples in the first and second embodiments.

Figure 25:
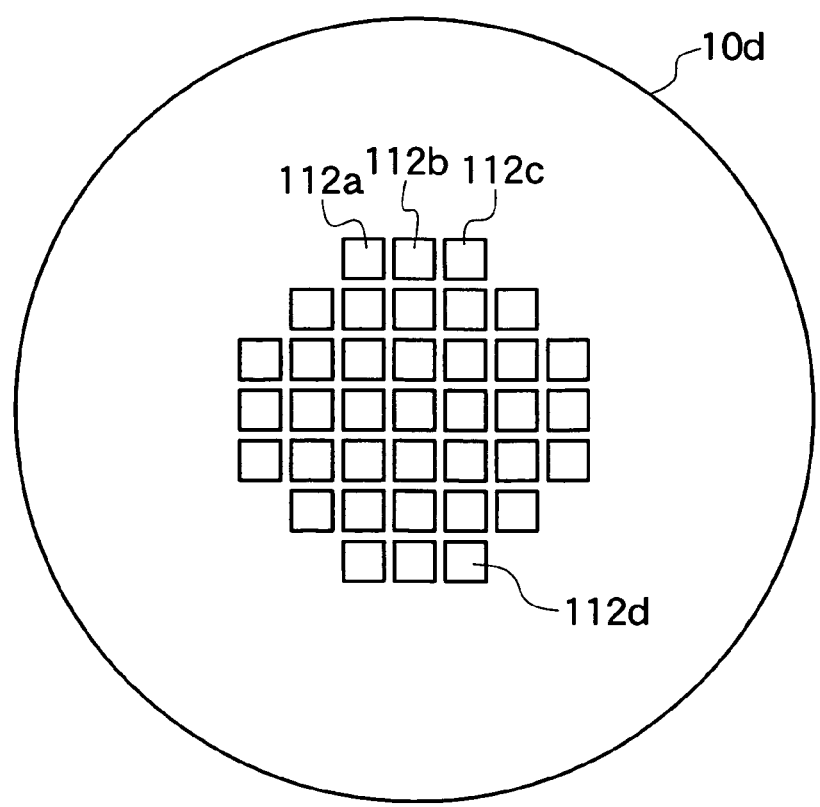
FIG. 25 is a diagram showing yet another example of a mask according to the third embodiment of the present invention.

Additionally, it is acceptable to provide a plurality of openings 112a, 112b, 112c, . . . , 112d on a mask 10d of a light shielding film, as shown in FIG. 25. The plurality of openings 112a, 112b, 112c, . . . , 112d are set to correspond to the plurality of chip regions 51a, 51b, 51c, . . . , 51d, respectively, as shown in FIG. 21. The light shielding film in between the plurality of openings 112a, 112b, 112c, . . . , 112d is set to correspond to the dicing line in between the plurality of chip regions 51a, 51b, 51c, . . . , 51d. It is possible to irradiate the light of the flash lamp onto the plurality of chip regions 51a, 51b, 51c, . . . , 51d on top of the semiconductor substrate 1, all at once, through the plurality of openings 112a, 112b, 112c, . . . , 112d.

Additionally, it is also acceptable to control the plurality of lamp elements 141a through 141d shown in FIG. 22 with the control system 20 of FIG. 17, and to scan the irradiation region with sequential irradiation, without using a mask. Because the outer edge of the semiconductor substrate 1 is included in each of the lamp elements 141a through 141d, it is desirable to combine use of a different mask such as the mask 10 and the mask 110 provided as examples in the first and second embodiments.

Figure 26:
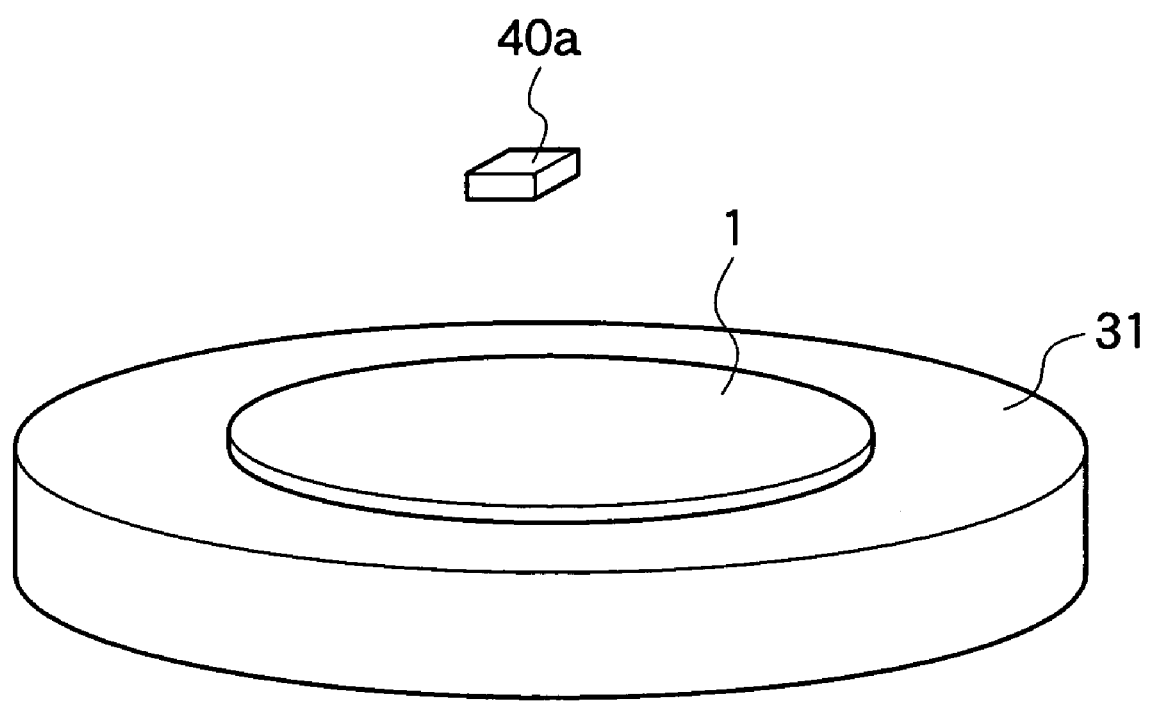
FIG. 26 is a diagram showing another example of a light source of an annealing apparatus according to the third embodiment of the present invention.

Further, it is possible to use a miniature light source 40a that covers only an essential irradiation region, without using a mask, as shown in FIG. 26. Note that, illustration of structural members of an annealing apparatus other than the light source 40a and the substrate stage 31 has been omitted from FIG. 26. For the light source 40a, the lamp element and the power supply including an electrical discharge capacitor can be reduced in size and weight. In a case in which the miniature light source 40a is used, it is acceptable scan the irradiation region while moving the light source 40a with a light source moving mechanism (not shown).

Modification of the Third Embodiment

In a modification of the third embodiment of the present invention, when annealing is performed with the annealing apparatus shown in FIG. 17, the annealing conditions are adjusted for each irradiation region. For example, the mask 10a shown in FIG. 18 having the restricted irradiation region corresponding to each of the chip regions 51a through 51d shown in FIG. 21, is used. The annealing conditions are modified based on the trend of the in-plane distribution of the previously measured sheet resistance. Therefore, it becomes possible to suppress the in-plane distribution of sheet resistance and to manufacture a semiconductor device having electrical properties of high uniformity. In the modification of the third embodiment, the aspect in which the annealing conditions are modified for each irradiation region differs from the third embodiment, and other configurations are identical. Thus, redundant description will be omitted.

For example, ions of B as p-type impurity are implanted to each of the chip regions 51a through 51d on top of the semiconductor substrate 1 shown in FIG. 21 at an acceleration energy of 0.5 keV and a dose amount of $1 \times 10^{15}$ cm$^{-2}$. Afterward, the semiconductor substrate 1 is placed on the substrate stage 31 of the annealing apparatus shown in FIG. 17. The chip regions 51a through 51d as well as the opening width WA of the opening 12a of the mask 10a is 20 mm×20 mm.

The semiconductor substrate 1 is pre-heated to 450° C. by the heating source 41. The substrate stage is successively moved by the substrate scanning system 32. Each of the chip regions 51a through 51d is taken as the irradiation region, so as to be heated by the light of the flash lamp of the light source 40 through the opening 12a. The pulse width of the flash lamp light of the light source 40 is 1 ms. The irradiation energy density of the light of the flash lamp transmitted onto the irradiation region on the center of the semiconductor substrate 1 is 24 J/cm². On the other hand, the irradiation energy density of the light of the flash lamp irradiated onto the irradiation region on the outer edge of the semiconductor substrate 1 is 26 J/cm². After activation annealing, electrical properties at each of the chip regions 51a through 51d is measured, and in-plane uniformity of the sheet resistance in the semiconductor substrate 1 is evaluated. By using the annealing method according to a modification of the third embodiment, the standard deviation a of the in-plane distribution of sheet resistance in the semiconductor substrate 1 decreases by approximately 0.6.

Generally, in the vicinity of the outer edge of the semiconductor substrate 1, heat is easily lost and heating efficiency decreases. However, in the modification of the third embodiment, because it is possible to modify the irradiation energy density for each of the irradiation regions as needed, it becomes possible to improve in-plane uniformity of the annealing temperature. Therefore, it is possible to suppress variations of the electrical properties of a semiconductor device, and to improve the production yield on an annealing process.

Other Embodiments

In the first through third embodiments of the present invention, a Xe flash lamp is used as the light source 40 shown in FIG. 1. However, the light source 40 is not limited to a Xe flash lamp. It is also possible to use a light source that can emit a high intensity light, such as a flash lamp using gasses such as other noble gas, mercury, hydrogen, and the like, a Xe arch discharge lamp, and a laser including an excimer laser, a YAG laser, a carbon monoxide (CO) gas laser, a carbon dioxide ($CO_2$) gas laser, and the like, as the light source 40. Furthermore, description of a structure having a plurality of lamp elements as the flash lamp has been put forth. However, the structure of the flash lamp is not limited. It is also possible to use a single-ended flash lamp.

Various modifications will become possible for those skilled in the art after storing the teachings of the present disclosure without departing from the scope thereof.

What is claimed is:

1. An annealing apparatus, comprising:
    a substrate stage placing a semiconductor substrate;
    a light source facing the substrate stage, configured to irradiate a pulsed light at a pulse width of approximately 0.1 ms to 100 ms on a surface of the semiconductor substrate; and
    a mask configured to selectively reduce intensity of the light transmitting a peripheral region along an outer edge of the semiconductor substrate, so as to define an irradiation region by the peripheral region.

2. The annealing apparatus of claim 1, wherein the mask has a light reduction rate of more than 0.2 for the intensity of light components including a peak wavelength of the light.

3. The annealing apparatus of claim 1, wherein the peripheral region has a width of over 2 mm from the outer edge.

4. The annealing apparatus of claim 1, wherein the mask has a rectangular-shaped opening.

5. The annealing apparatus of claim 1, further comprising, a substrate scanning system configured to move the substrate stage within a plane facing the light source.

6. The annealing apparatus of claim 1, further comprising, a mask scanning system configured to move a mask stage on which the mask is placed, within a plane facing the light source.

7. The annealing apparatus of claim 1, wherein the light source is one of a flash lamp, a laser, and an arc discharge lamp.

8. The annealing apparatus of claim 1, wherein the substrate stage has a heating source configured to heat the semiconductor substrate.

9. An annealing method, comprising:
    heating a semiconductor substrate to a temperature range of approximately 300° C. to 600° C.; and
    irradiating at least one of a surface of the semiconductor substrate and a surface of a thin film formed on the semiconductor substrate with a pulsed light at a pulse width of approximately 0.1 ms to 100 ms, by selectively reducing intensity of the light transmitting a peripheral region along an outer edge of the semiconductor substrate, so as to define an irradiation region by the peripheral region.

10. The annealing method of claim 9, wherein the intensity of the light transmitting the peripheral region is reduced with a rate of more than 0.2 for the intensity of the light components including a peak wavelength of the light.

11. The annealing method of claim 9, wherein the light transmitting the peripheral region is reduced by a mask provided between the substrate stage and a light source emitting the light.

12. The annealing method of claim 11, wherein the mask is moved within a plane facing the light source.

13. The annealing method of claim 9, wherein the light transmitting the peripheral region is reduced by a mask formed on a surface of the peripheral region.

14. The annealing method of claim 9, wherein the peripheral region has a width of over 2 mm from the outer edge.

15. The annealing method of claim 9, wherein the substrate stage is moved within a plane facing a light source emitting the light.

16. The annealing method of claim 9, wherein the light is irradiated at an irradiation energy density in a range of approximately 15 $J/cm^2$ to 40 $J/cm^2$.

17. A manufacturing method of a semiconductor device, comprising:
    treating at least one of a semiconductor substrate and a thin film formed on the semiconductor substrate with a first process so as to provide an intermediate product of the semiconductor device;
    heating the semiconductor substrate to a temperature range approximately 300° C. to 600° C.;
    irradiating a surface of the intermediate product with a pulsed light at a pulse width of approximately 0.1 ms to 100 ms, by selectively reducing intensity of the light transmitting a peripheral region along an outer edge of the intermediate product, so as to define an irradiation region by the peripheral region; and
    treating the intermediate product with a second process.

18. The manufacturing method of claim 17, wherein the intensity of the light transmitting the peripheral region is reduced with a rate of more than 0.2 for the intensity of the light components including a peak wavelength of the light.

19. The manufacturing method of claim 17, wherein the light transmitting the peripheral region is reduced by a mask provided between the substrate stage and a light source emitting the light.

20. The manufacturing method of claim 17, wherein the intensity of the light transmitting the peripheral region is reduced by a mask formed on a surface of the peripheral region.

* * * * *